United States Patent
Matsuyoshi et al.

(10) Patent No.: US 6,545,542 B2
(45) Date of Patent: Apr. 8, 2003

(54) POWER AMPLIFIER WITH COUPLER FOR CROSS-COUPLING AMPLIFIERS FOR REDUCTION OF DIFFERENTIAL FREQUENCY COMPONENT

(75) Inventors: Toshimitsu Matsuyoshi, Osaka (JP); Kaoru Ishida, Osaka (JP); Masayuki Miyaji, Kanagawa (JP); Seiji Fujiwara, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/982,882

(22) Filed: Oct. 22, 2001

(65) Prior Publication Data

US 2002/0067211 A1 Jun. 6, 2002

(30) Foreign Application Priority Data

Oct. 23, 2000 (JP) ........................................ 2000-323074

(51) Int. Cl.⁷ ................................................. H03F 3/04
(52) U.S. Cl. ................... 330/301; 330/124 R; 330/295; 330/302
(58) Field of Search ............................. 330/124 R, 295, 330/301, 302

(56) References Cited

U.S. PATENT DOCUMENTS

| 4,772,856 A | 9/1988 | Nojima et al. ............... 330/251 |
| 6,201,445 B1 * | 3/2001 | Morimoto et al. ........... 330/295 |

FOREIGN PATENT DOCUMENTS

JP 63153904 6/1988

OTHER PUBLICATIONS

Schellenberg "A Broadband, Push–Pull Power MMIC Operating at K/Ka–Band Frequencies", Microwave Symposium Digest, 2002 IEEE MTT–S International, vol.: 2, pp. 909–912.*
English Language Abstract of JP 63–153904.

* cited by examiner

Primary Examiner—Michael B Shingleton
(74) Attorney, Agent, or Firm—Greenblum & Bernstein, P.L.C.

(57) ABSTRACT

A power amplifier that reduces intermodulation distortion generated by the amplifier while reducing the number of parts is provided. A power amplifier comprises a first balun, to which a combined signal combining two signals of different frequencies is inputted, and which outputs, based on the combined signal, the first and the second signal whose phase are opposite; a first amplifier that outputs the first amplified signal containing the differential frequency component comprising the difference of the frequencies of two signals from the first signal; a second amplifier that outputs the second amplified signal containing the component comprising the difference of the frequencies of two signals from the second signal; and a second balun that outputs the combined signal of the first and the second amplified signals. The component contained in the first and the second amplified signal are inputted via the second and the first amplifier, respectively, to reduce the component.

24 Claims, 27 Drawing Sheets

| 100 | POWER AMPLIFIER | 105 | AMPLIFIER |
|---|---|---|---|
| 101 | INPUT TERMINAL | 105a | INPUT OF AMPLIFIER |
| 102 | OUTPUT TERMINAL | 105b | OUTPUT OF AMPLIFIER |
| 103 | BALUN | 106 | AMPLIFIER |
| 103a | INPUT OF BALUN | 106a | INPUT OF AMPLIFIER |
| 103b | FIRST OUTPUT OF BALUN | 106b | OUTPUT OF AMPLIFIER |
| 103c | SECOND OUTPUT OF BALUN | 107 | CAPACITOR(IMPEDANCE ELEMENT) |
| 104a | OUTPUT OF BALUN | | |
| 104b | FIRST INPUT OF BALUN | | |
| 104c | SECOND INPUT OF BALUN | | |

SIGNAL WAVEFORM AT SECOND OUTPUT 103c
SIGNAL WAVEFORM AT FIRST OUTPUT 103b

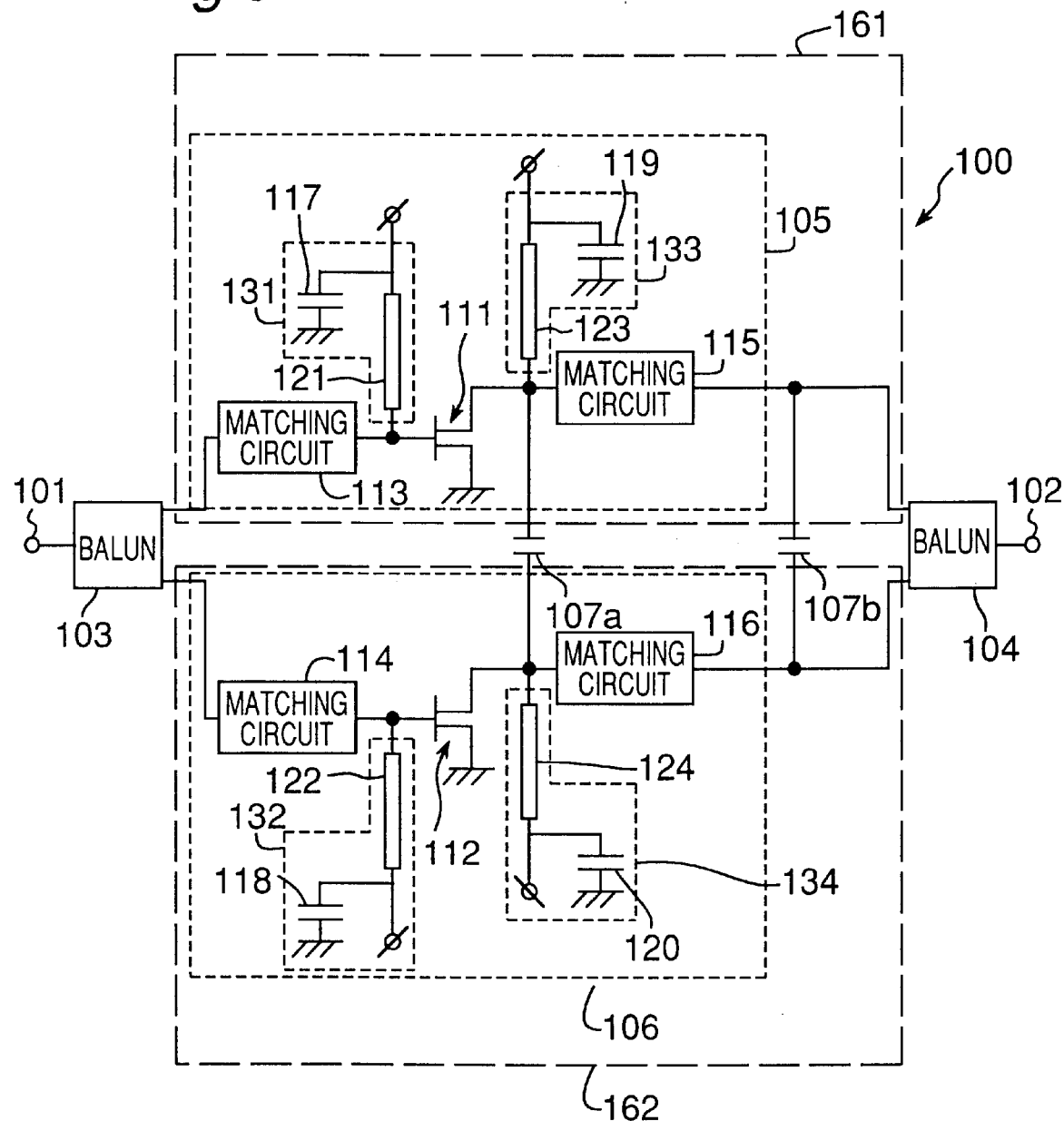

RESONANCE CHARACTERISTICS OF CAPACITOR

SIGNAL (①) CONTAINING Δf COMPONENT AND
Δf COMPONENT SIGNAL (②) WITH PHASE DEVIATED ARE ADDED

↓

Δf COMPONENT ARE CANCELLED EACH OTHER

↓

INTERMODULATION DISTORTION IS REDUCED

POWER AMPLIFIER WITH COUPLER FOR CROSS-COUPLING AMPLIFIERS FOR REDUCTION OF DIFFERENTIAL FREQUENCY COMPONENT

BACKGROUND OF THE INVENTION

The present invention relates to a power amplifier used at mobile communication base stations primarily of cellular phones, etc.

In recent years, for transmitters of base stations of mobile communication apparatus, power amplifiers with high-efficiency and as linear characteristics as possible are required for batch-amplifying a large number of signal channels. In order to make the power amplifier characteristics as linear as possible, it is essential to adopt distortion compensation using, for example, feed-forward method, etc. as well as to reduce distortion of power amplifiers themselves.

FIG. 31 is a drawing showing a conventional power amplifier 600. The power amplifier 600 includes an input terminal 601, output terminal 602, baluns 603, 604, and amplifiers 605, 606. Amplifiers 605, 606 include amplifying elements 611, 612, matching circuits 613, 614 on the input side, matching circuits 615, 616 on the output side, capacitors for input-side bias circuit 617, 618, and capacitors for output side bias circuit 619, 620. Amplifiers 605 and 606 operate as push-pull amplifiers. Each of capacitor 619 and 620 actually comprises a plurality of capacitors. That is, capacitors that provide low impedance at the specified signal frequency and capacitors that provide low impedance at the frequency that corresponds to the frequency difference (frequency intervals) when a plurality of signals are entered. By mounting capacitors for output-side bias circuit 619, 620, intermodulation distortion generated in amplifiers is suppressed and characteristics of power amplifiers can be brought to linearity as much as possible.

However, in the conventional power amplifier 600, capacitors 619, 620 must be mounted for bias circuits of each of the push-pull amplifiers 605 and 606, and the number of parts is increased. In addition, because capacitors 619, 620 must have, in general, a large capacity and low resistance, the increased number of parts increase the overall circuit scale. Furthermore, fluctuations are generated in the degree of suppression of intermodulation distortion in accord with the frequency intervals of a plurality of signals entered in amplifiers.

SUMMARY OF THE INVENTION

It is an object of the present invention to provide a power amplifier that reduces intermodulation distortion generated in amplifiers while reducing the number of parts.

A power amplifier according to the present invention comprises a first balun, to which a combined signal combining two signals of different frequencies is inputted, and which outputs, based on the combined signal, the first and the second signal whose phase are opposite; a first amplifier which outputs the first amplified signal containing the frequency component comprising a difference of two signal frequencies from the first signal, the second amplifier which outputs the second amplified signal containing the frequency component comprising a difference of two signal frequencies from the second signal, and the second balun which outputs the combined signal of the first and the second amplified signals, wherein the frequency component contained in the second amplified signal is entered into the interval from the first balun to the second balun via the first amplifier to reduce the frequency component, and the frequency component contained in the first amplified signal is entered in the interval from the first balun to the second balun via the second amplifier to reduce the frequency component.

According to the present invention, when a plurality of signals are entered in the push-pull amplifier, the component of the frequency interval Δf generated at the output terminal in the push-pull amplifier is reduced. Consequently, the intermodulation distortion generated at the amplifier can be suppressed and no capacitor is necessary to be disposed in the bias circuit as is the case of a conventional amplifier, the number of parts can be reduced. As a result, the linearity of the amplifier is increased, and a power amplifier that can amplify a large number of signal channels collectively without distortion can be obtained.

BRIEF DESCRIPTION OF THE DRAWINGS

These and other object and features of the present invention will become clear from the following description taken in conjunction with the preferred embodiments thereof with reference to the accompanying drawings, in which:

FIG. 9 is a circuit diagram of power amplifier according to embodiment 2;

DETAILED DESCRIPTION OF THE PREFERRED EMBODIMENTS

Referring now to drawings, embodiments of the present invention will be described in detail as follows.
(Embodiment 1)

Figure 1:
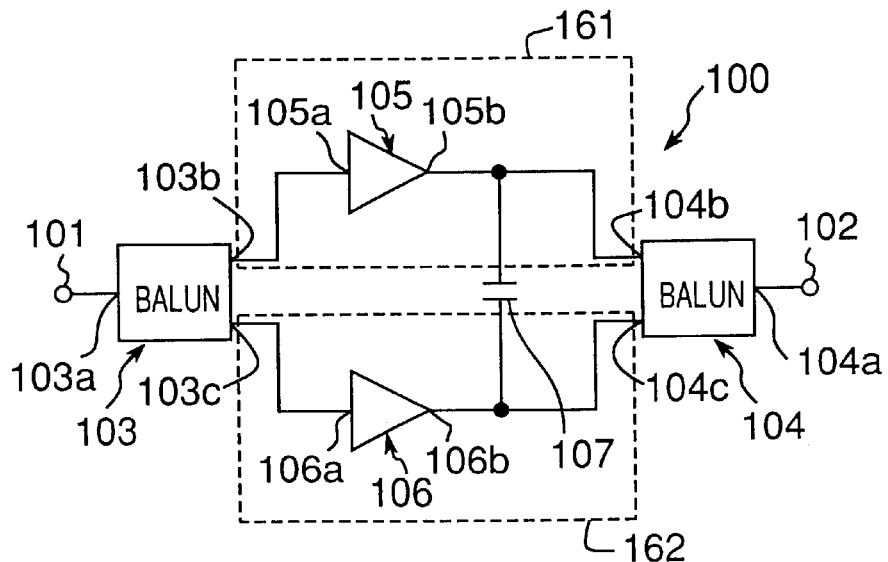
FIG. 1 is a block diagram of a configuration of the embodiment 1 according to the present invention.

FIG. 1 is a block diagram showing the configuration of the power amplifier 100 according to embodiment 1. The power amplifier 100 comprises an input terminal 101, first balun 103 equipped with input 103a, the first output 103b, and second output 103c, an amplifier 105 equipped with input 105a and output 105b, an amplifier 106 equipped with output 106a and output 106b, capacitor 107 which is an impedance element, second balun 104 equipped with first input 104b and second input 104c and output 104a, and an output terminal 102.

The connection relation in the power amplifier 100 is described as follows. The input terminal 101 is connected to the input 103a of balun 103, the first output 103b and the second output 103c of balun 103 are connected to the input 105a of amplifier 105 and the input 106a of amplifier 106, respectively. The output 105b of amplifier 105 and the output 106b of amplifier 106 are connected to the first input 104b and the input 104c of second balun 104, respectively. The output 104a of balun 104 is connected to the output terminal 102. Further, the capacitor 107 is connected across the output 105b of amplifier 105 and the output 106b of amplifier 106. Hereinafter, the course that arrives at the first input 104b of balun 104 from the first output 103b of balun 103 via the amplifier 105 is designated as the first amplification path 161. The course that arrives at the second input 104c of balun 104 from the second output 103c of balun 103 via the amplifier 106 is designated as the second amplification path 162.

Figure 2:
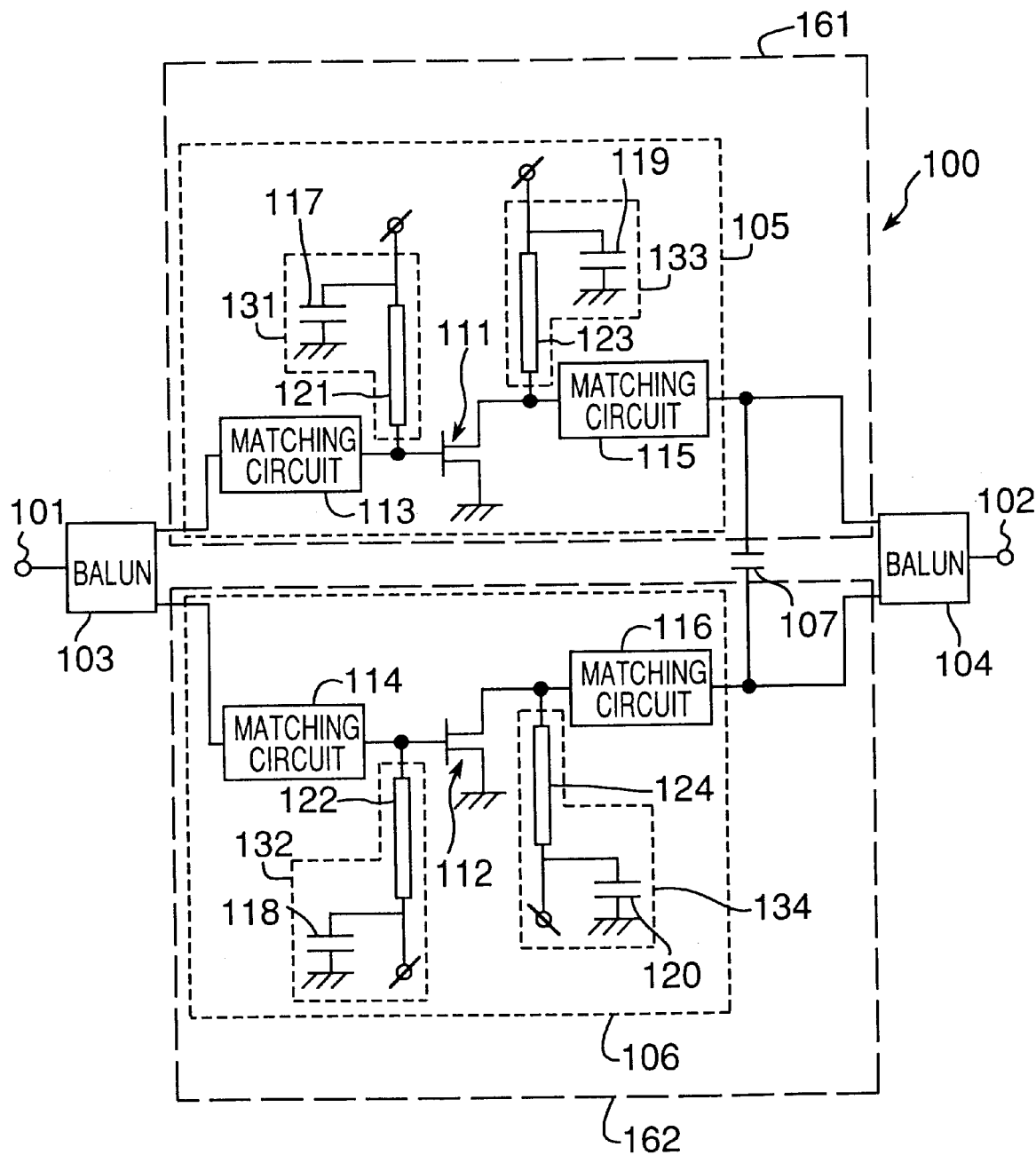
FIG. 2 is a specific circuit configuration of the power amplifier.

FIG. 2 shows a specific circuit configuration of the power amplifier 100. The amplifier 105 comprises an amplification element 111 composed with transistors, an input-side matching circuit 113 that matches input-side impedance, an output-side matching circuit 115 that matches output-side impedance, an input-side bias circuit 131 that gives bias to the input side, and an output-side bias circuit 133 that gives bias to the output side. To the gate of the amplification element 111, the input-side matching circuit 113 and the input-side bias circuit 131 are connected. Furthermore, to the drain of the amplification element 111, the output-side matching circuit 115 and the output-side bias circuit 133 are connected. The input-side bias circuit 131 includes a transmission line 121 and a capacitor 117 for input-side bias circuit. The output-side bias circuit 133 includes a transmission line 123 and a capacitor 119 for output-side bias circuit. The transmission line 121 and the transmission line 123 are, for example, a quarter wavelength line of the input signal frequency. In addition, capacitors 117, 119 provide low impedance at the input signal frequency.

In the meantime, the amplifier 106 of power amplifier 100 comprises an amplification element formed 112 by transistors, an input-side matching circuit 114, an output-side matching circuit 116, an input-side bias circuit 132, and an output-side bias circuit 134. To the gate of amplification element 112, an input-side matching circuit 114 and an input-side bias circuit 132 are connected. To the drain of the amplification element 112, the output-side matching circuit 116 and the output-side bias circuit 134 are connected. Furthermore, the input-side bias circuit 132 includes a transmission line 122 and a capacitor 118 for the input-side bias circuit. The output-side bias circuit 134 includes a transmission line 124 and a capacitor 120 for the out-side bias circuit.

Figure 3:
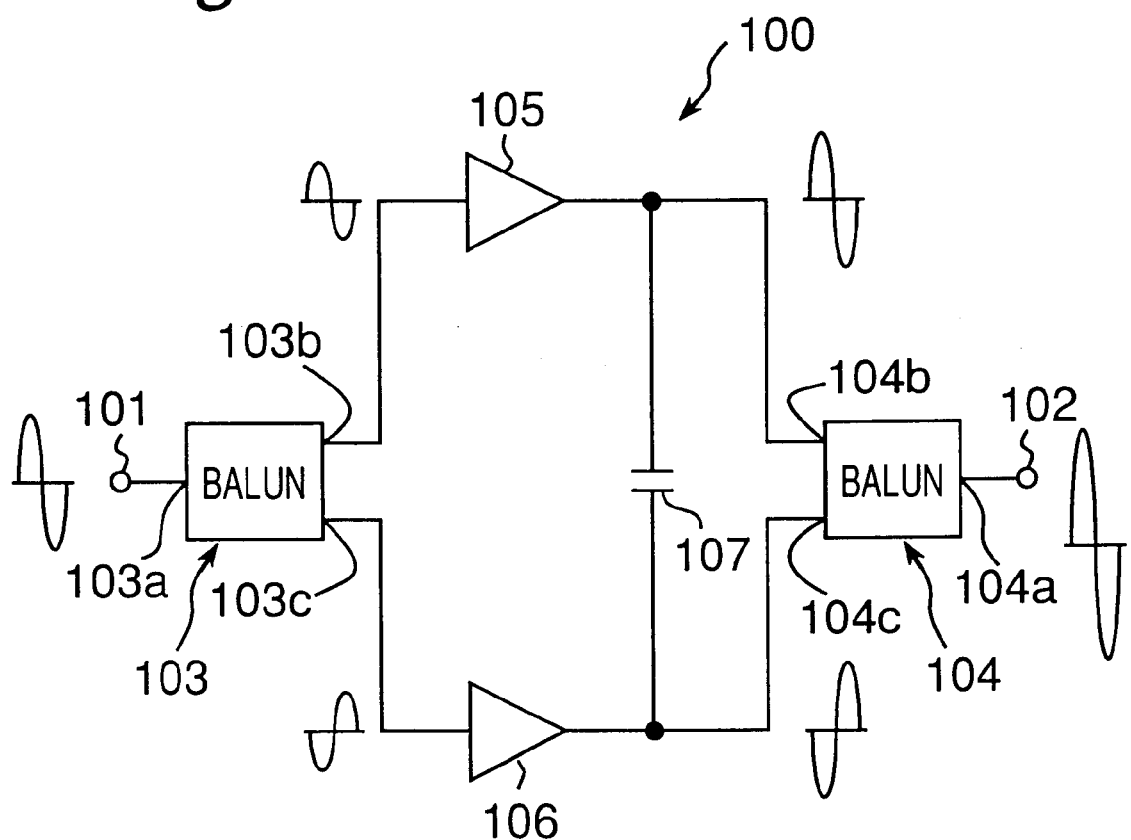
FIG. 3 is a block diagram of signal waveforms at each section of the power amplifier.

Referring now to FIG. 3, the basic operation of the power amplifier 100 is described. FIG. 3 is a block diagram showing signal waveforms at each section of the power amplifier 100. The unbalanced signal inputted from the input terminal 101 is converted into the first signal and the second signal by the balun 103, and is outputted from the first output 103b and the second output 103c, respectively. More specifically, balanced signals with the same amplitude and 180° out-of-phase are outputted from the first output 103b and the second output 103c, respectively. That is, balun 103 converts one input signal into two signals whose phase only is 180° shifted each other, and outputs the signals, respectively. The first signal and the second signal are amplified by the amplifier 105 and the amplifier 106 which operate as push-pull amplifiers, respectively. The amplified first signal and the second signal are entered from the first input 104b of balun 104 and the second input 104c into the balun 104, respectively, and converted into amplified signals, which are unbalanced signals. That is, the balun 104 amplifies two input signals with the phase only 180° shifted and converts into one signal, and outputs. The converted amplified signal is outputted from the output terminal 102. As a result, the signal entered from the input terminal 101 is outputted as an amplified signal at the output terminal 102.

The bias circuit 131 (FIG. 2) and the bias circuit 133 (FIG. 2) of the amplifier 105 provide high impedance in terms of input signal frequency as seen from the input signal line to the amplifier 105. That is, the bias circuit 131 (FIG. 2) and the bias circuit 133 (FIG. 2) do not exert influence on signal operations. This applies to the bias circuit of the amplifier 106.

Figure 4A:
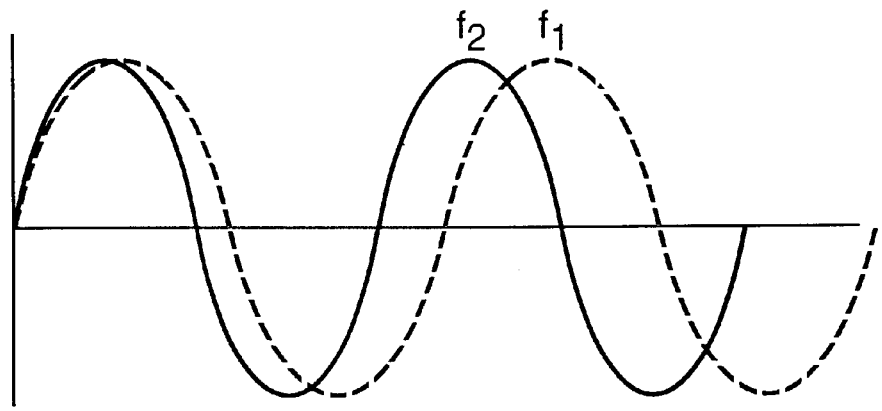
FIG. 4A is a waveform chart of signals at frequencies f1 and f2.
Figure 4B:
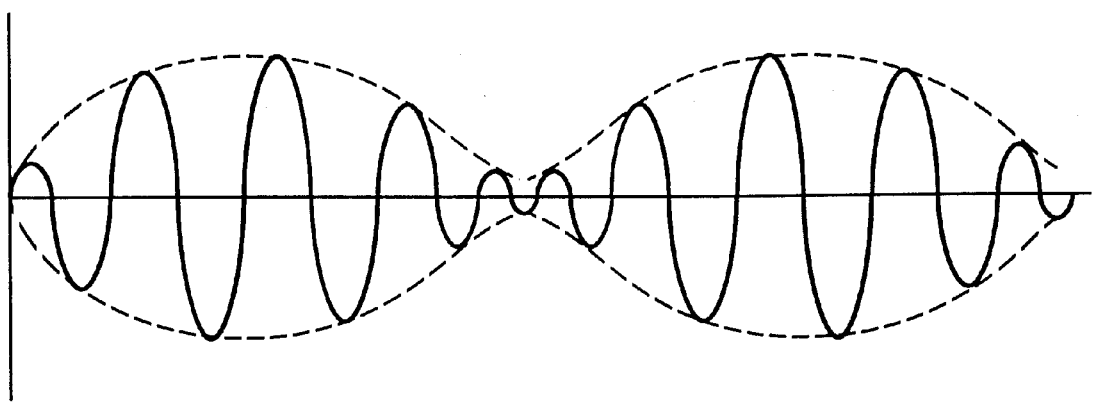
FIG. 4B is a waveform chart of combined signals combining signals at frequencies f1 and f2.
Figure 4C:
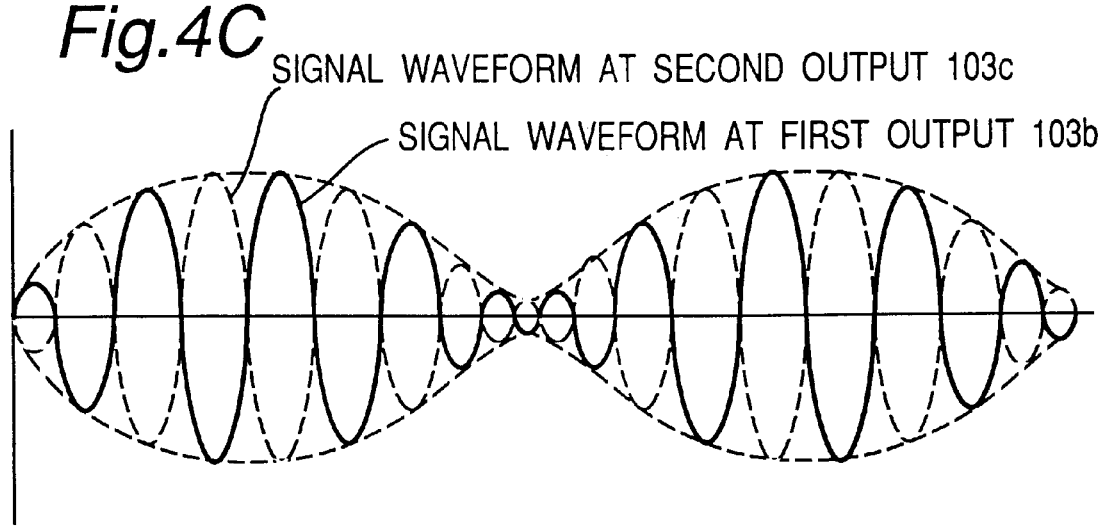
FIG. 4C is a diagram of waveforms of the first signal and the second signal transformed and outputted by a balun.

Now, consider the case in which two signals of sufficiently small frequency intervals with respect to the signal frequencies are inputted into the input terminal 101. Even when two signals are inputted, the power amplifier 100 carries out the above-mentioned basic operation. However, in such event, intermodulation distortion is generated due to nonlinearity of the amplifier. Now, assume that f1 and f2 (for example, f1 is 2000 MHz and f2 2010 MHz) denote the frequencies of two signals entered, respectively. FIG. 4A is a waveform chart of signals of frequencies f1 and f2. Then, FIG. 4B is a waveform chart of combined signals combining signals of frequency f1 and frequency f2. FIG. 4C is a drawing showing waveforms of the first signal and the second signal converted and outputted by the balun 103 (FIG. 3). The first signal and the second signal after conversion are amplified by the amplifier 105 and the amplifier 106, respectively.

Figure 5A:
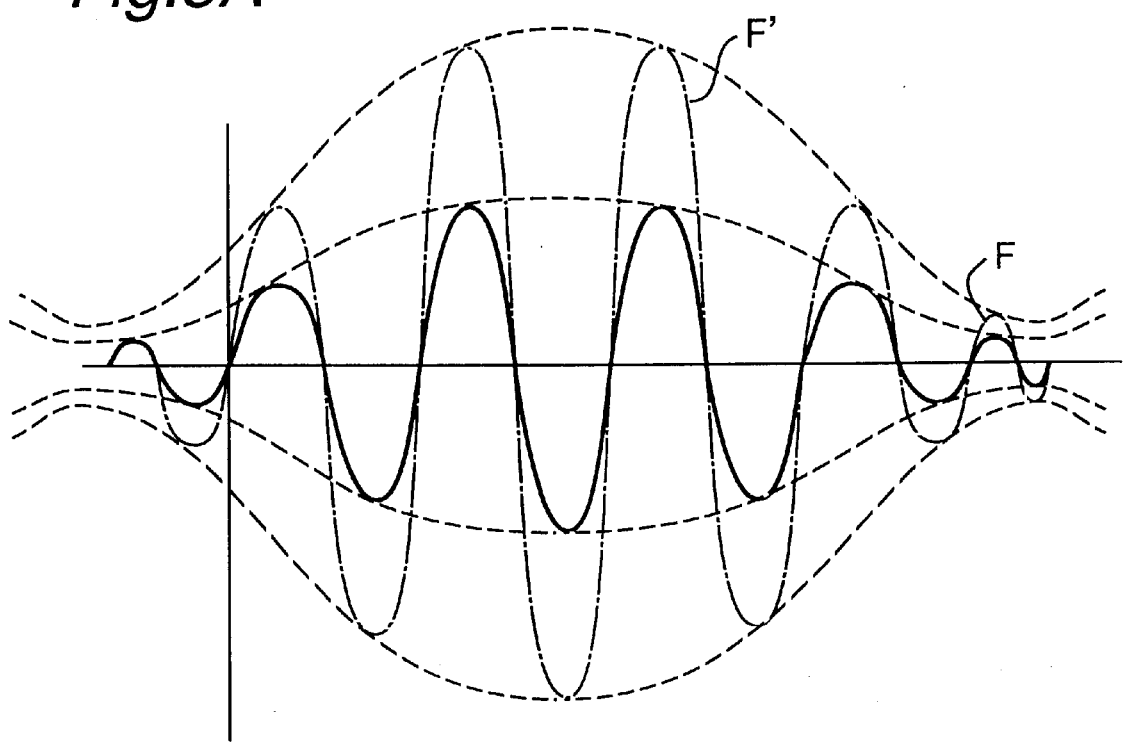
FIG. 5A is a diagram of waveforms of combined signals entered in each amplifier composing a push-pull amplifier and ideal waveform of amplified signals.
Figure 5B:
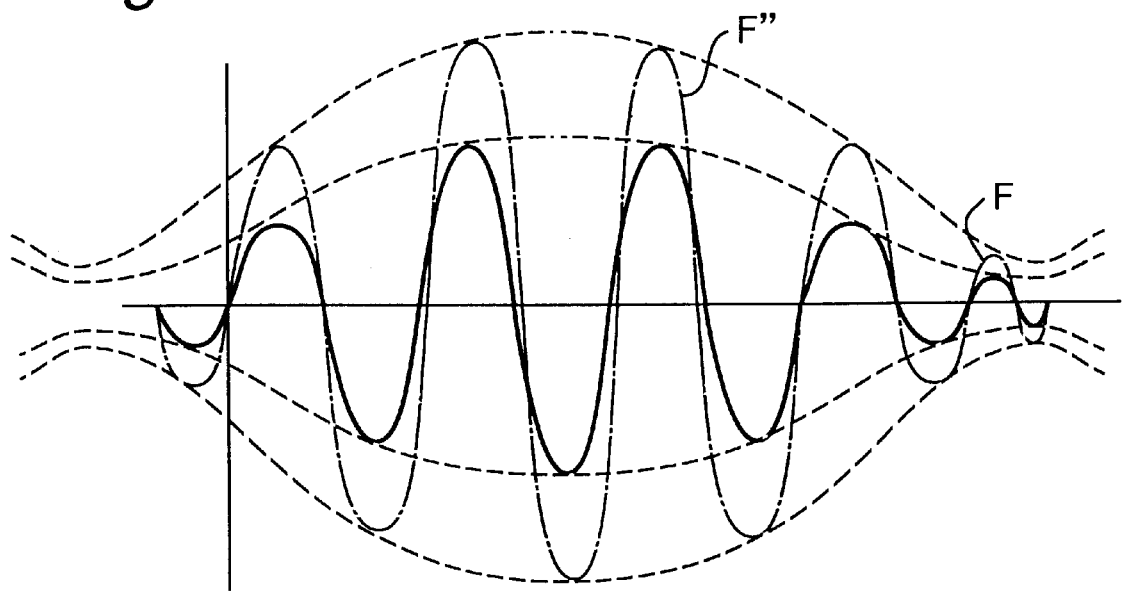
FIG. 5B is a diagram of waveforms of combined signals entered and waveforms of actual amplified signals.

Now, consider the case in which the first signal is amplified. For example, assume that the amplifier 105 (FIG. 3) has characteristics that amplify the amplitude to double. Referring now to FIG. 5A, let F denote the signal waveform of the input signal, and the signal waveform of the ideal amplified signal is shown as F'. However, the signal waveform of actual amplified signal is not expressed as F' but the signal waveform as shown in F" of FIG. 5B is provided. This is caused by distortion arising from nonlinearity of the amplifier 105. The signal waveform F" does not provide the linear amplification as it approaches the vertex of the envelope, and in addition, shift is generated in the phase.

Figure 6A:
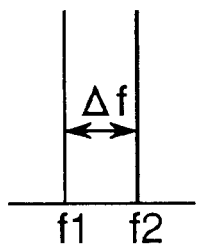
FIG. 6A is a frequency spectrum of two signal waves of frequencies f1, f2 before amplification.

FIGS. 6A to 6D show the spectrum distributions as a result of analyzing components of signal waveform F' shown in FIG. 5A. FIG. 6A shows the frequency spectrum of two signal waves of frequencies f1, f2 before amplification. Let $\Delta f$ denote the absolute value of the difference between frequencies f1 and f2 ($=|f1-f2|$). Hereinafter, $|f1-f2|$ or $\Delta f$ is referred to as a frequency interval.

Figure 6B:
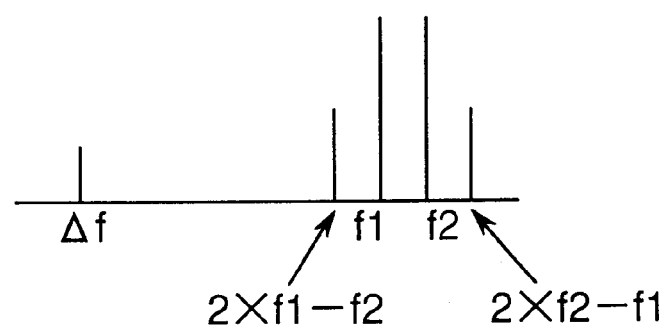
FIG. 6B is a frequency spectrum of third-order distortion generated at frequency 2f1–f2 and 2f2–f1.
Figure 6C:
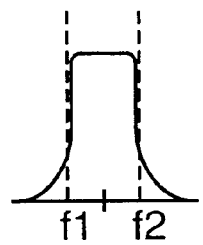
FIG. 6C is a frequency spectrum of two sides of the component curve of modulated wave which are designated f1, f2.
Figure 6D:
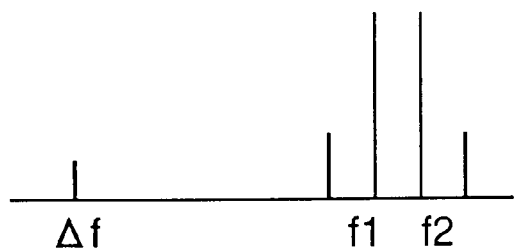
FIG. 6D is a frequency spectrum of reduced third-order intermodulation distortion.

Of intermodulation distortions, what matters most is the third-order distortion. As shown in FIG. 6B, the third-order distortion is generated at frequency 2f1-f2 and 2f2 -f1. One of the factors of generating the third-order intermodulation distortion is assumed to be attributed to the mixing of the frequency $\Delta f$ component (FIG. 6B) generated due to nonlinearity of the amplifier 105 and the signal frequency f1 (or f2) component in the push-pull amplifier again. Consequently, if the frequency $\Delta f$ component can be suppressed to a small value as shown in FIG. 6D, the third-order intermodulation distortion generated can be reduced. The frequency $\Delta f$ component is equal to the frequency interval $\Delta f$ shown in FIG. 6A.

Therefore, in embodiment 1, across the output 105b of amplifier 105 (FIG. 1) and the output 106b of amplifier 106 (FIG. 1), a capacitor 107 (FIG. 1) is connected. Capacitor 107 (FIG. 1) has characteristics to provide low impedance with respect to frequency $\Delta f$. In other words, let $\Delta f$ denote the self-resonance frequency of the capacitor 107 (FIG. 1). As a result, the $\Delta f$ component from the output 105b of amplifier 105 (FIG. 1) and the $\Delta f$ component from the output 106b of amplifier 106 (FIG. 1) can be reduced, respectively. The reasons are explained as follows.

Referring now again to FIG. 1, the relevant $\Delta f$ components are of the same amplitude and same phase in the two balanced outputs 105b and 106b of push-pull amplifiers 105, 106. As described above, in the present embodiment, a capacitor 107 that achieves low impedance with respect to the frequency $\Delta f$. The capacitor 107 transmits the $\Delta f$ component nearly as it is. Now, placing attention to the output 105b of the amplifier 105, the $\Delta f$ component is outputted and at the same time, the $\Delta f$ component of the same amplitude and same phase transmitted from the output 106b of the amplifier 106 is inputted. At the output 106b of the amplifier 106, this is reversed. At outputs 105b, 106b, theoretically, $\Delta f$ components are not offset each other.

However, because in actuality, the circuit wiring contains impedance components and $\Delta f$ component out-of-phase is generated, the $\Delta f$ components are partially canceled and reduced. Consequently, generation of mixing of frequency $\Delta f$ component with signal frequency (f1 or f2) components can be canceled, and the third-order intermodulation distortion generated at the amplifier can be reduced. Furthermore, the number of parts can be reduced from the conventional. In addition, since there is no need to use two capacitors with same characteristics, it has the outstanding effects in that degradation of characteristics caused by individual difference of capacitor is not necessarily taken into account. As described above, according to embodiment 1, a power amplifier with intermodulation distortion reduced and with the number of parts reduced can be achieved.

In Embodiment 1, the signals inputted are two sine wave signals of frequencies f1, f2. However, if two sides of the component curve of modulated wave shown in FIG. 6C are designated f1, f2, respectively, the same effects can be obtained with modulated waves.

Figure 7:
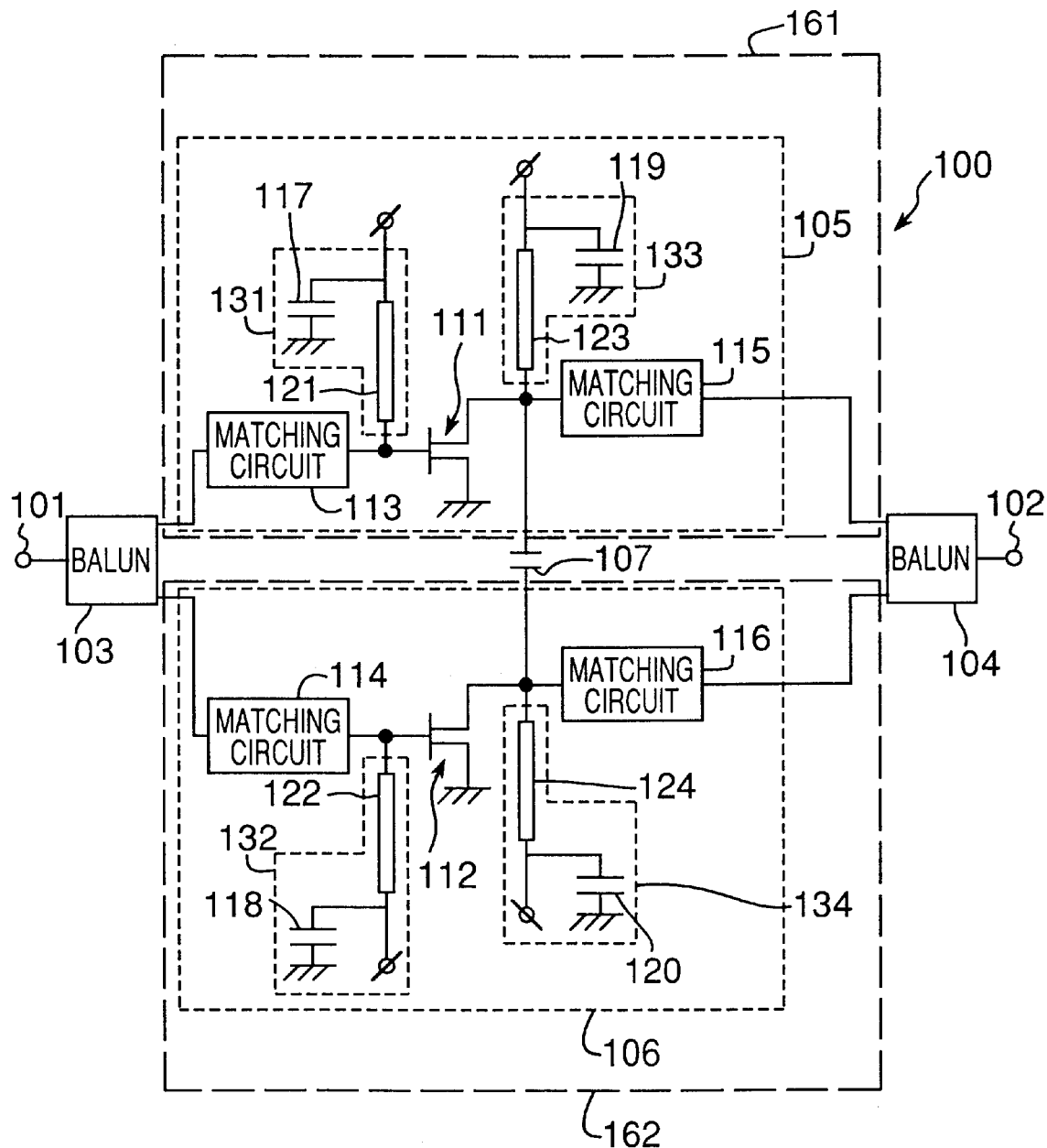
FIG. 7 is a circuit diagram of another example of the power amplifier of FIG. 1.

In embodiment 1, the capacitor 107 (FIG. 1) was connected to the output side of output-side matching circuits 115 and 116. However, with the configuration different from this configuration, the same effects can be obtained. FIG. 7 is a circuit diagram of power amplifier 100 using another example. The power amplifier 100 may be connected to the amplifier element sides of the output-side matching circuit 115, 116, that is, across the output-side matching circuits 115, 116 and the drain terminals of amplification elements 111, 112. What is needed is that the capacitor 107 is connected across the first amplification path 161 and the second amplification path 162.

Figure 8:
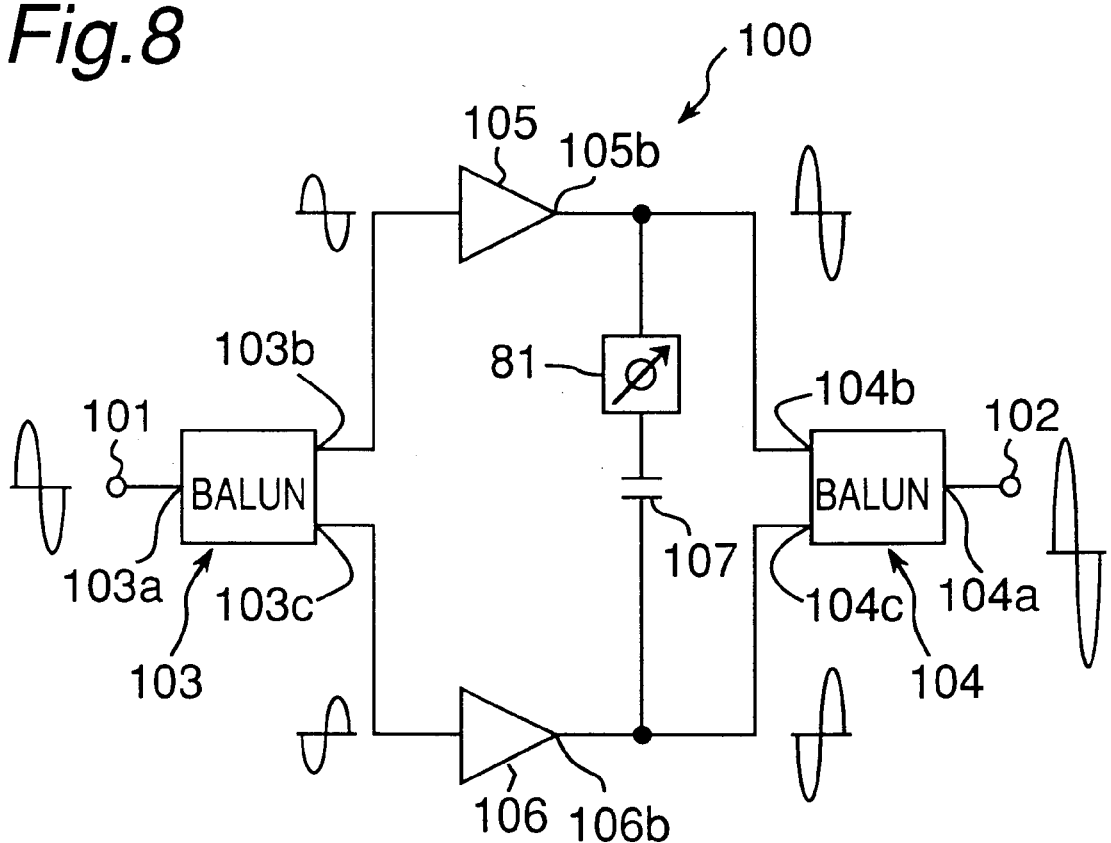
FIG. 8 is a block diagram of the configuration of the electric power amplifier that reduces the Δf component.

Next discussion will be made on the configuration to further reduce the $\Delta f$ component. FIG. 8 is a block diagram showing the configuration of power amplifier 110 for educing the $\Delta f$ component. Hereinafter, the component elements which are different in the power amplifier 110 from the power amplifier 100 (FIG. 3) only will be explained and the explanation of the same component elements will be omitted.

What is different in the power amplifier 110 from the power amplifier 100 (FIG. 3) is the phase shifter 81 which is mounted in series with the capacitor 107. The phase shifter 81 can change a phase of an input signal. Specifically, phase shifter 81 outputs the signal of the $\Delta f$ component outputted from the amplifier 105 whose phase is opposite to that of the $\Delta f$ component signal outputted from the amplifier 106. That is, each of $\Delta f$ components outputted from phase shifter 81 coincides in amplitude and is nearly opposite in phase. As a result, $\Delta f$ component is reduced at output 105b of the amplifier 105, as well as at output 106b of amplifier 106. Therefore, the third-order phase shift can be greatly reduced. Furthermore, changing the phase with the phase shift caused by the impedance of circuit wiring can offset in such as manner that the $\Delta f$ component becomes practically 0.

The phase shifter 81 may be connected in series with the capacitor 107 explained in FIG. 7 and may be connected across the output of the amplifier 105 and the output of the amplifier 106.

(Embodiment 2)

FIG. 9 is a circuit diagram of the power amplifier 100 according to embodiment 2. The same composition elements as the component elements descried in Embodiment 1 are denoted by the same reference numerals, and the explanation will be omitted.

In what the power amplifier 100 shown in FIG. 9 differs from the power amplifier according to embodiment 1 is the capacitors connected not only across the outputs between amplifier 105 and 106, in other words, not only across the inputs of the first input and the second input of the balun 104, but also across drains of the amplifier elements 111 and 112. Let 107a denotes the capacitor across drains of the amplification elements 111 and 112, and 107b denotes the capacitor between inputs of balun 104.

Figure 10A:
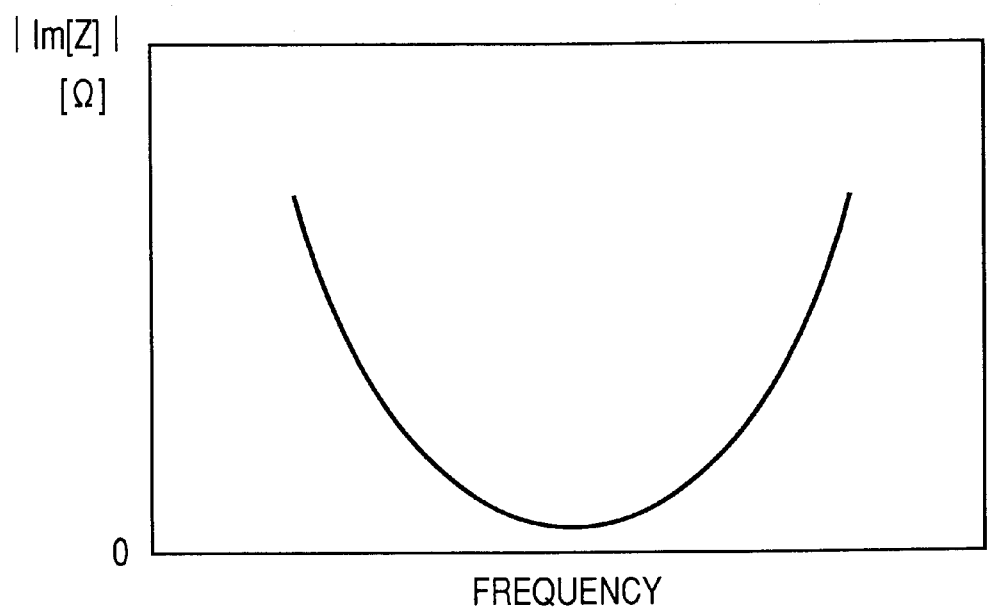
FIGS. 10A and 10B are graphs of examples of resonance characteristics of capacitors.
Figure 10B:
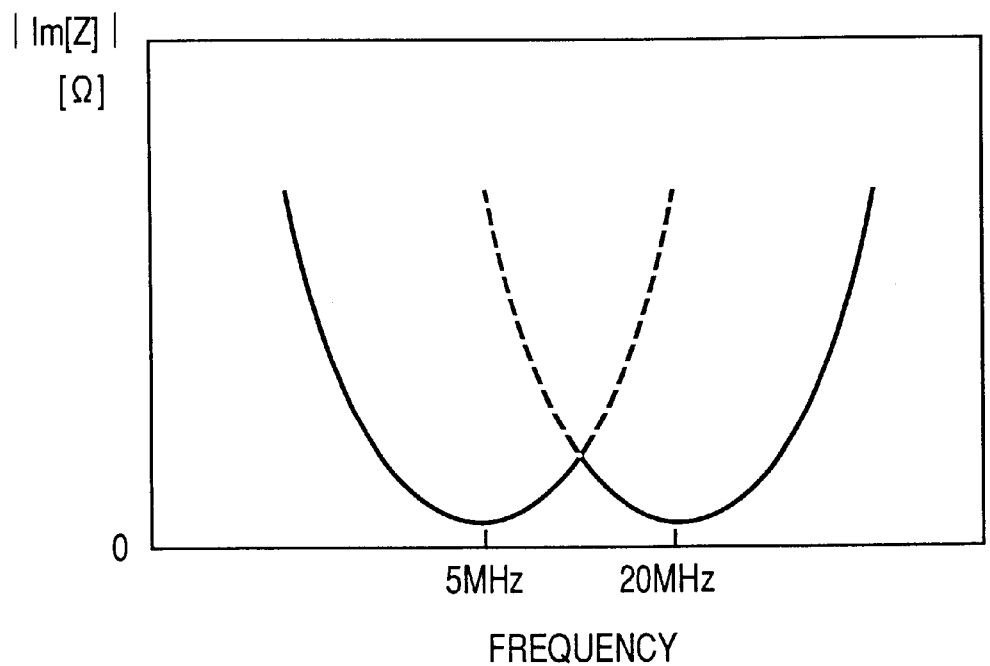

In, general, the actual capacitor has its own specific resonance frequency, and the impedance at the resonance frequency becomes close to 0 Ω. Consequently, by mounting capacitor 107b, the intermodulation distortion by Δf component equivalent to the self-resonance frequency of the capacitor can be reduced. However, at the frequency remote from the self resonance frequency, the impedance becomes high. FIGS. 10A and 10B are graphs showing examples of resonance characteristics of the capacitor. As clear from FIG. 10A, the frequency bandwidth that indicates low impedance characteristics is generally narrow in the capacitor.

The frequency of the signal entered into the power amplifier has a certain band width, and at which frequency a carrier signal should be used is different in accord with cases. Consequently, the frequency interval Δf has a specified width. As described above, since the capacitor has generally a narrow frequency bandwidth that indicates low impedance characteristics, when the frequency interval Δf value differs from the self resonance frequency of the capacitor 107a (FIG. 9), intermodulation distortion may not be reduced.

Therefore, even when the value of the signal frequency interval Δf is varied, intermodulation distortion must be reduced. In embodiment 2, a capacitor 107a which has the self resonance frequency different from the capacitor 107b is further connected. The frequency band with small impedance of the capacitor 107 and the frequency band with small impedance of capacitor 107b has an overlapping section. Accordingly, intermodulation distortion that corresponds to a wide range of frequency interval Δf can be reduced. That is, it is possible to reduce the intermodulation distortion in accordance with the changes of the frequency interval Δf of two signals entered. For example, as shown in FIG. 10B, a capacitor 107a whose self resonance frequency is 5 MHz and a capacitor 107b whose self resonance frequency is 20 MHz are mounted. By this, intermodulation distortion during amplification of a plurality of signals can be reduced throughout the range of 5 MHz to 20 MH2 of frequency interval Δf.

In Embodiment 2 as is the case of Embodiment 1, the power amplifier that can reduce intermodulation distortion while the number of parts is reduced from the conventional can be achieved.

Furthermore, in embodiment 2, one of the two capacitors is connected across drains of the amplification element 111 and the amplification element 112, while the other one is connected across the two inputs of output-side balun 104 after passing the matching circuits 115 and 116. Connection points shall not be limited to the foregoing but both two may be connected across drain terminals of the push-pull amplifier. Alternatively, both two may be connected across the first input and the second input of the output-side balun 104. Even in these cases, the effects similar to those of embodiment 2 can be obtained.

In embodiment 2, two kinds of capacitors with different self resonance frequency are used. However, three or more kinds of capacitors with different self resonance frequencies may be used. The connection position may be freely set as long as it is across the first amplification path 151 and the second amplification path 152. Even in such case, the effects similar to those of embodiment 2 can be obtained.

Furthermore, by mounting a phase shifter described referring to FIG. 8, intermodulation distortion when a plurality of signals are amplified can be greatly reduced. The phase shifter may be located at the place where the Δf component signal is transmitted via relevant capacitors. The phase shifter in the number that corresponds to the number of capacitors may be mounted or the phase shifter may be mounted for the specific capacitors only.

(Embodiment 3)

Figure 11:
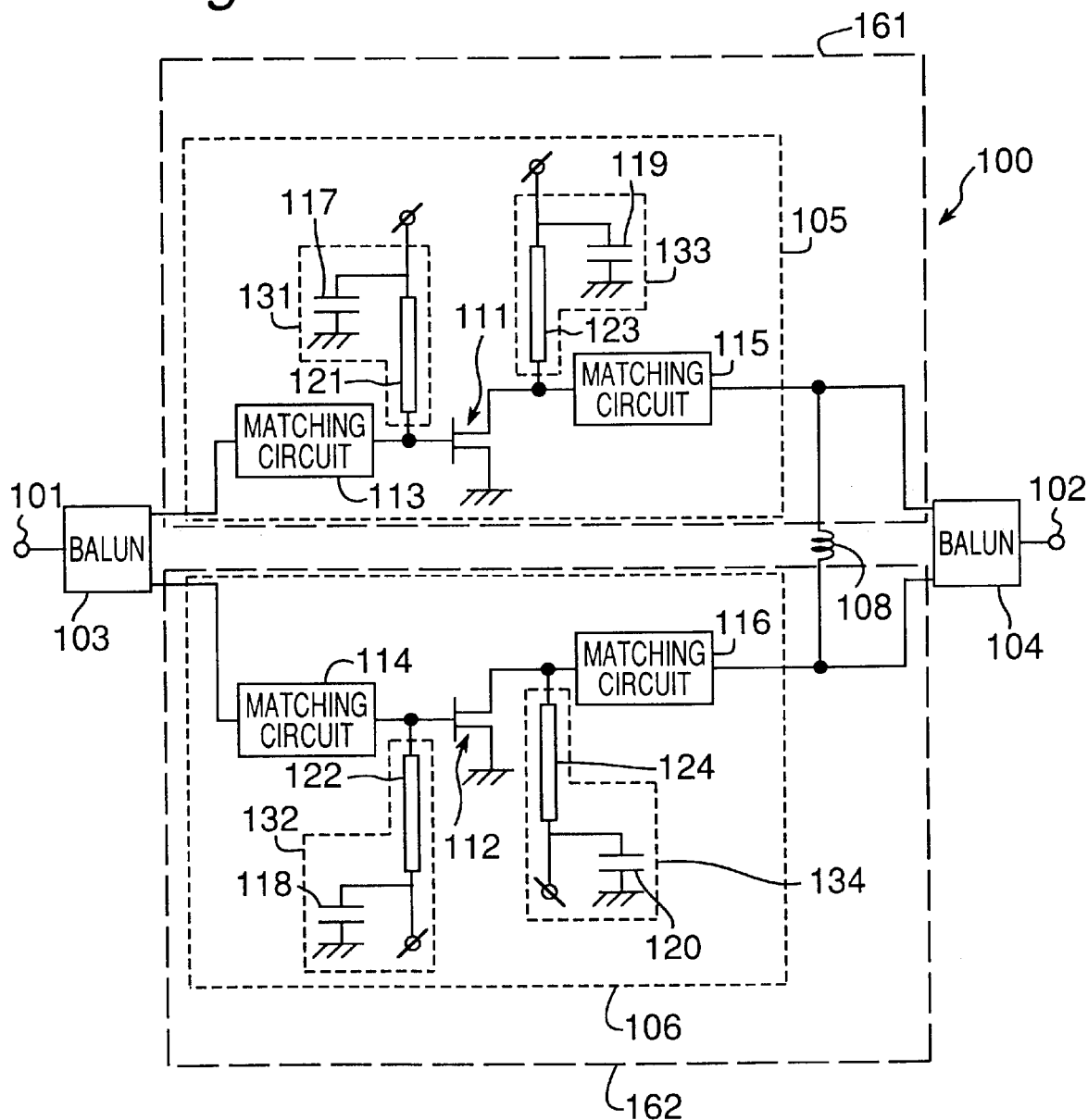
FIG. 11 is a circuit diagram of power amplifier according to embodiment 3.

FIG. 11 is a circuit diagram of the power amplifier 100 according to embodiment 3. The like reference numerals are given to the like component elements described in embodiment 1 and their description will be omitted.

In what the power amplifier 100 shown in FIG. 11 differs from the power amplifier according to embodiment 1 is that not a capacitor but an inductor 108 is connected across outputs of push-pull amplifiers 105 and 106. The inductor 108 is also an impedance element.

The reason why the inductor 108 is installed is the same as the capacitor 107 in embodiments 1, 2. Consider the case in which two signals of frequencies f1, f2 are entered in the power amplifier 100. The frequency interval Δf is sufficiently smaller than the signal frequencies. In addition, in the vicinity of the frequency Δf, the inductor 108 provides low impedance. In such event, the Δf component that appears in the output 105b of the amplifier 105 and the output 106b of the amplifier 106 offset each other by the same reason described in embodiment 1. As a result, mixing of Δf component with the signal frequency (f1 or f2) in the amplifier does not occur, and as is the case of embodiment 1, the third-order intermodulation distortion that occurs in the amplifier can be reduced. As compared to the conventional, a power amplifier with the number of parts reduced can be achieved.

The inductor 108 is further characterized in that the inductor 108 provides low impedance characteristics even at the frequency lower than the frequency Δf. Accordingly, connecting the inductor 108 across outputs of push-pull amplifiers can reduce the intermodulation distortion even when frequency intervals Δf of a plurality of signals inputted to amplifiers vary.

Figure 12:
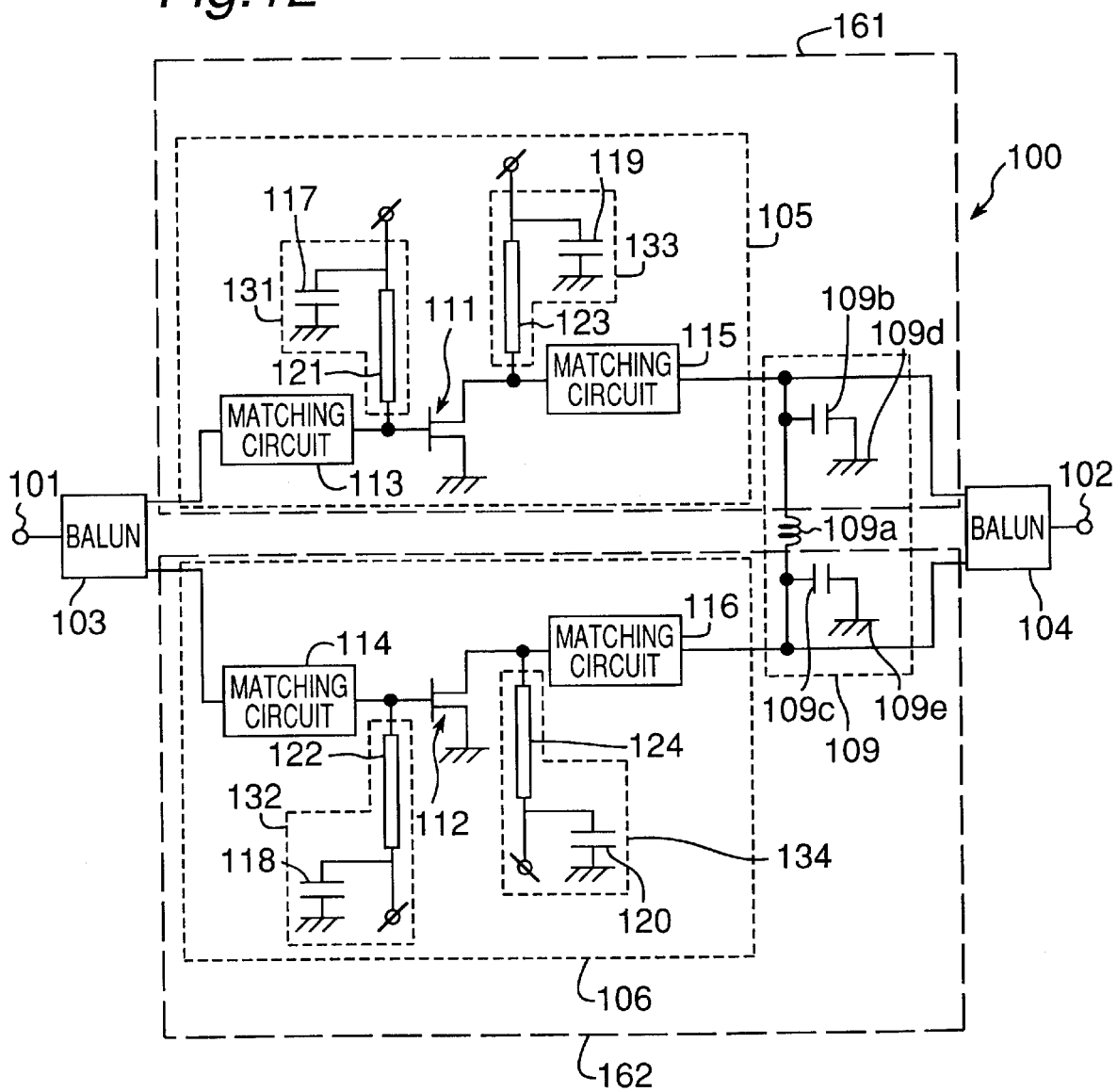
FIG. 12 is another circuit diagram of another example of the power amplifier of FIG. 11.

In embodiment 3, the inductor 108 was used for the impedance element that provides low impedance at frequency Δf, but in place of the inductor 108, the configuration shown in FIG. 12 may be adopted.

FIG. 12 is a circuit diagram showing another example of the power amplifier 100 by embodiment 3. The power amplifier 100 includes an inductor 109a to be connected across outputs of push-pull amplifiers in place of the inductor 108, low-pass type filter 109, capacitor connected across the output 105b of the amplifier 105 and ground 109d, and low-pass type filter 109 composed with capacitor 109c connected across the output 106b of the amplifier 106 and ground 109e. By using the low-pass type filter 109 in place of the inductor 108, a wider band width which becomes low impedance can be obtained.

Needless to say, the same effects of the present embodiment can be achieved with a low-pass type filter with a configuration different from the configuration described above. In addition, as described referring to FIG. 8 in embodiment 1, a phase shifter may be installed to reduce the frequency interval Δf more definitely.

(Embodiment 4)

Figure 13:
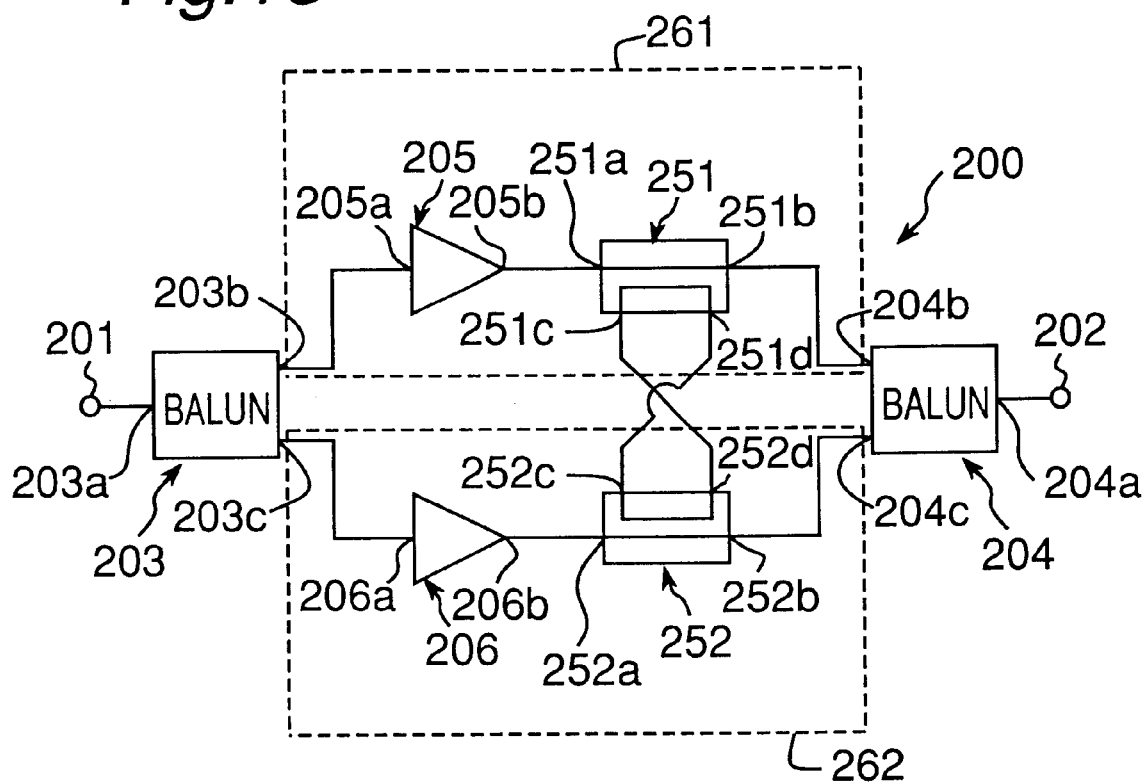
FIG. 13 is a block diagram of the configuration of the electric power amplifier according to embodiment 4.

FIG. 13 is a block diagram showing a configuration of a power amplifier 200 according to embodiment 4. The power amplifier 200 has the same functions as those power amplifiers described in embodiments 1 through 3. That is, when a plurality of signals with sufficiently small frequency intervals are entered with respect to the signal frequency, the power amplifier 200 reduces the intermodulation distortion (in particular, third-order intermodulation distortion) and outputs amplified signals free of phase shift to input signals.

First of all, the configuration of power amplifier 200 is described. The power amplifier 200 comprises an input terminal 201, first balun 203 that has input 203a, first output 203b, and second output 203c, amplifier that has input 205a and output 205b, amplifier 206 that has input 206a and output 206b, second balun 204 that has input 204a, first output 204b and second output 204c, first directional coupler 51, second directional coupler 52, and output terminal 202.

For the directional couplers 51, 52, known directional couplers that can couple the signals that propagate in specific directions only in the transmission line to the secondary line can be used. The degree of attenuation which the signal is subject to when the signal passes the directional coupler to enter the secondary line is called the degree of coupling and is expressed in decibel. The first directional coupler 51 of the power amplifier 200 comprises the first terminal 251a, second terminal 251b, third terminal 251c, and fourth terminal 251d. The second directional coupler 52 comprises the first terminal 252a, second terminal 252b, third terminal 252c, and fourth terminal 252d.

The connection relation inside the power amplifier 200 is described as follows. The input terminal 201 is connected to the input 203a of balun 203, the first output 203b and second output 203c of balun 203 are connected to the input 205a of amplifier 205 and the input 206a of amplifier 206, respectively. The output 205b of the amplifier 205 is connected to the first terminal 251a of the first directional coupler 251 and the output 206b of the amplifier 206 is connected to the first terminal 252a of the second directional coupler 252.

The connection relation of the directional coupler is described as follows. For the first directional coupler 251, the second terminal 251b is connected to the first input 204b of balun 204. The third terminal 251c is connected to the fourth terminal 252d of the second directional coupler 252. The fourth terminal 251d is connected to the third terminal 252c of the second directional coupler 252. On the other hand, the second terminal of the second directional coupler 252 is connected to the second input 204c of balun 204. The third terminal 252c and the fourth terminal 252d are connected as above.

Hereinafter, the course arriving at the first input 204b of balun 204 from the first output 203b of the balun 203 via the amplifier 205 and first directional coupler 251 is called the first amplification path 261. The course arriving at the second input 204c of the balun 204 from the second output 203c of the balun 203 via the amplifier 206 and the second directional coupler 252 is called the second amplification path 262.

Figure 14:
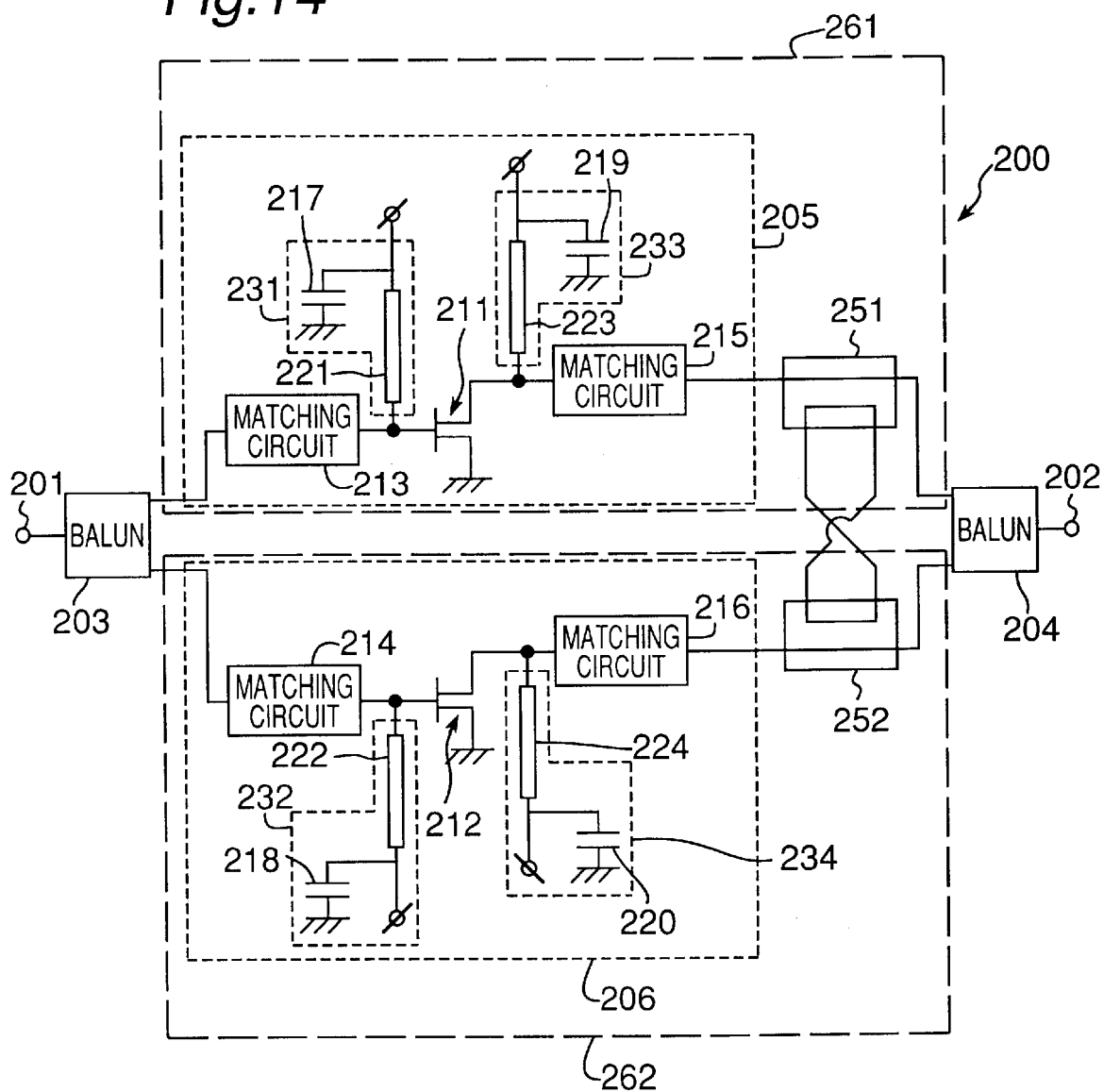
FIG. 14 is a diagram of a specific circuit configuration of the power amplifier.

FIG. 14 shows a specific circuit configuration of the power amplifier 200. As clear from the figure, functions and configurations of amplifiers 205, 206 of power amplifier 200 are same as the configurations of amplifiers 105, 106 (FIG. 7). Consequently, the description on them will be omitted.

Figure 15:
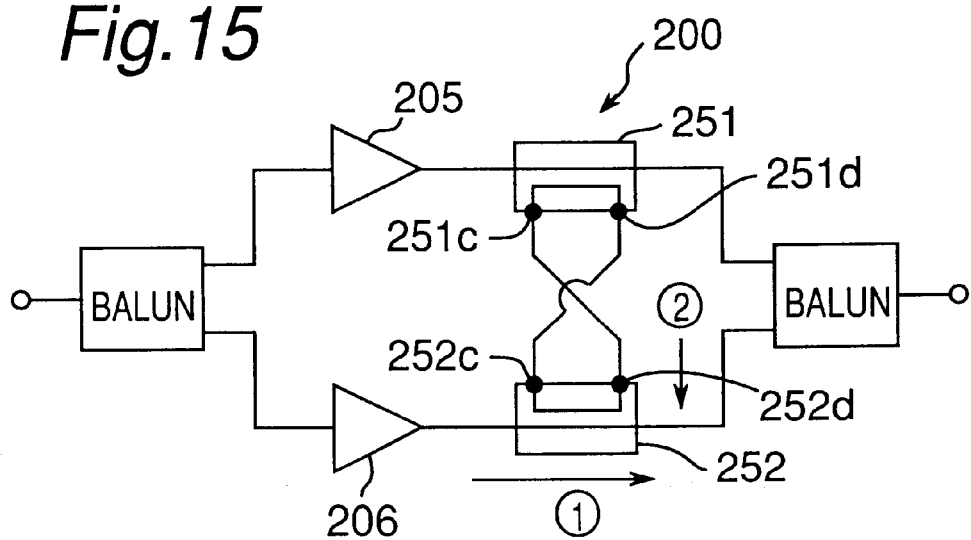
FIG. 15 is a diagram of a principle for reducing intermodulation distortion.

As described above, the basic functions of the power amplifier 200 are same as those of the power amplifier according to embodiments 1 through 3. Referring now to FIG. 15, the principle why the power amplifier 200 can reduce intermodulation distortion (in particular, third-order intermodulation distortion) will be described.

FIG. 15 is a drawing showing the principle of reducing intermodulation distortions. To the input terminal 201, two signals of sufficiently small frequency intervals for the signal frequency are entered. The two signal frequencies to be entered are designated as f1 and f2, respectively, (for example, f1 denotes 200 MHz and f2 2010 MHz). The frequency interval (|f1−f2|) is defined as Δf. As described in embodiment 1, it is also an object of the embodiment 4 to reduce Δf in order to reduce intermodulation distortion, in particular, third-order intermodulation distortion.

Therefore, in embodiment 4, a directional coupler which has 3 dB degree of coupling with respect to the frequency Δf that indicates the frequency intervals of two signals and which scarcely couples with respect to signal frequency is used. That is, the Δf component only is extracted from the third terminal 251c of the first directional coupler 251 and the third terminal 252c of the second directional coupler 252. The Δf component extracted from the third terminal 251c of the first directional coupler 251 is inputted to the fourth terminal 252d of the second directional coupler 252 and combined with the output of the amplifier 206. The output signal of the amplifier 206 contains the Δf component. Note that the phase is shifted between this Δf component and the Δf component inputted to the fourth terminal 252d. This is because the phase shift volume varies when the wiring length of the circuit varies as the circuit wiring contains the impedance component. As a result, the Δf components are offset with each other and the Δf component is reduced. In the same manner in the first directional coupler 251, the Δf component contained in the output signal of the amplifier 205 is offset with the Δf component with the phase shifted and taken out from the third terminal 252c of the second directional coupler 252 and reduced.

As described above, since the Δf component generated in each amplifier which composes the push-pull amplifier is offset with each other, mixing of the Δf component with the signal frequency (f1 or f2) may not be appeared. Consequently, the third-order intermodulation distortion generated in the amplifier can be reduced. In embodiment 4, the degree of coupling of the directional coupler is designated as 3 dB, but the effects of suppressing intermodulation distortion can be obtained even when the different value is assigned to the degree of coupling.

Figure 16:
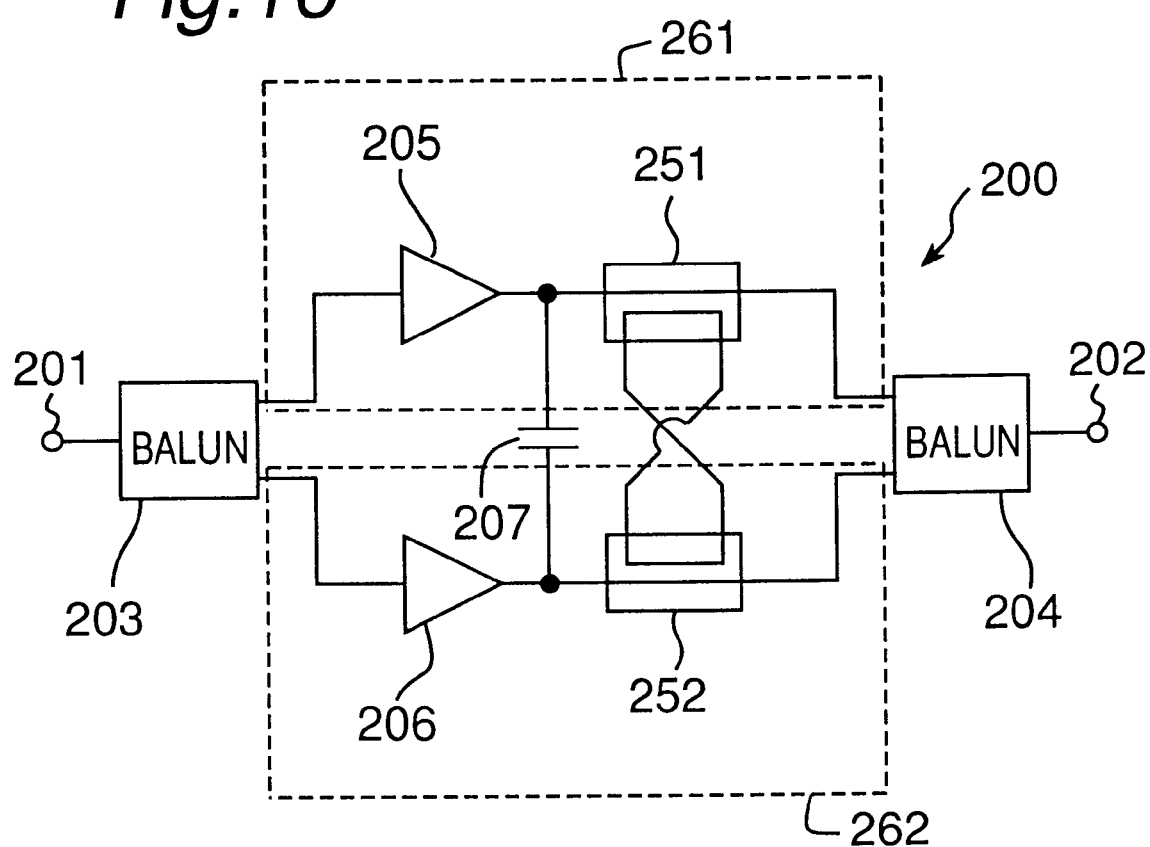
FIG. 16 is a block diagram of another example of the power amplifier of FIG. 13.

Next discussion will be made on the configuration that can furthermore reduce the intermodulation distortion. FIG. 16 is a block diagram showing another example of the power amplifier 200. In this example, as described in embodiments 1 through 3, one or more capacitors 207 which provide low impedance at the frequency Δf, the frequency intervals of two signals, are added. The intermodulation distortion can be suppressed in accordance with still wider range of frequency intervals Δf by shifting the frequency that increases the degree of coupling of the directional coupler and the self resonance frequency of the capacitor.

In place of the capacitor 207, one or more inductors that provide low impedance at frequency Δf which is the frequency intervals of two signals, as described in embodiment 3 may be added. The intermodulation distortion can be suppressed in accordance with still wider range of frequency intervals Δf by shifting the frequency that increases the degree of coupling of the directional coupler and the frequency at which the inductor provides low impedance. The connection point of the capacitor 207 to the inductor can be freely set as long as it is between the first amplification path 261 and the second amplification path 262.

Figure 17:
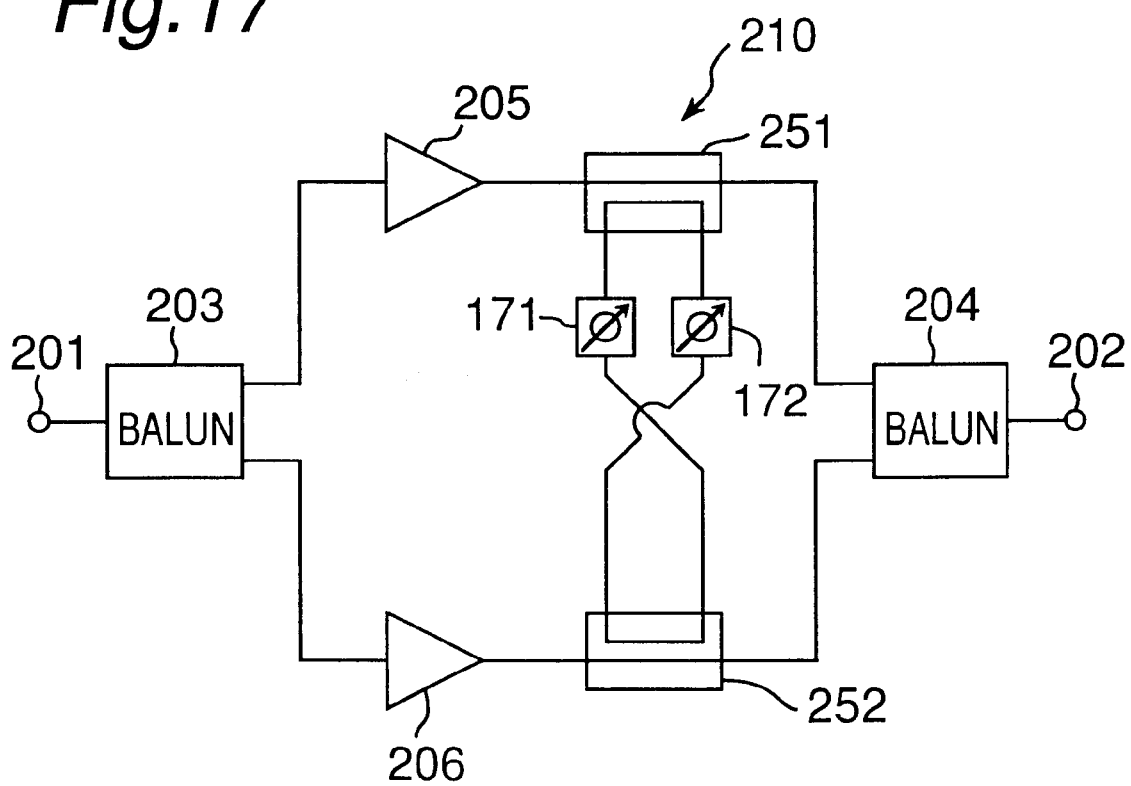
FIG. 17 is a diagram of a power amplifier with two phase shifters.

Furthermore, according to the power amplifier 200 shown in FIG. 17, the intermodulation distortion can be greatly reduced when a plurality of signals are amplified. FIG. 17 shows the power amplifier 210 with two phase shifters provided. What differs from the power amplifier 200 (FIG. 13) is that two phase shifters 171, 172 are disposed on the wiring between the first directional coupler 251 for transmitting the Δf component signal and the second directional coupler 252. Phase shifter 171 outputs the signal of the Δf component outputted from the amplifier 305 whose phase is opposite to that of the Δf component signal outputted from the amplifier 206. Consequently, the Δf components become of the same amplitude and nearly opposite phase, and are reduced. Accordingly, the third-order intermodulation distortion generated in the amplifier can be greatly reduced. Furthermore, by changing the phase with the phase shift by the wiring impedance of the circuit taken into account, it is possible to offset the Δf component in such a manner that it becomes practically zero. The phase sifters may be located at the position where the Δf component signal is transmitted via relevant capacitors, and are not limited to the locations shown in FIG. 17.

(Embodiment 5)

Figure 18:
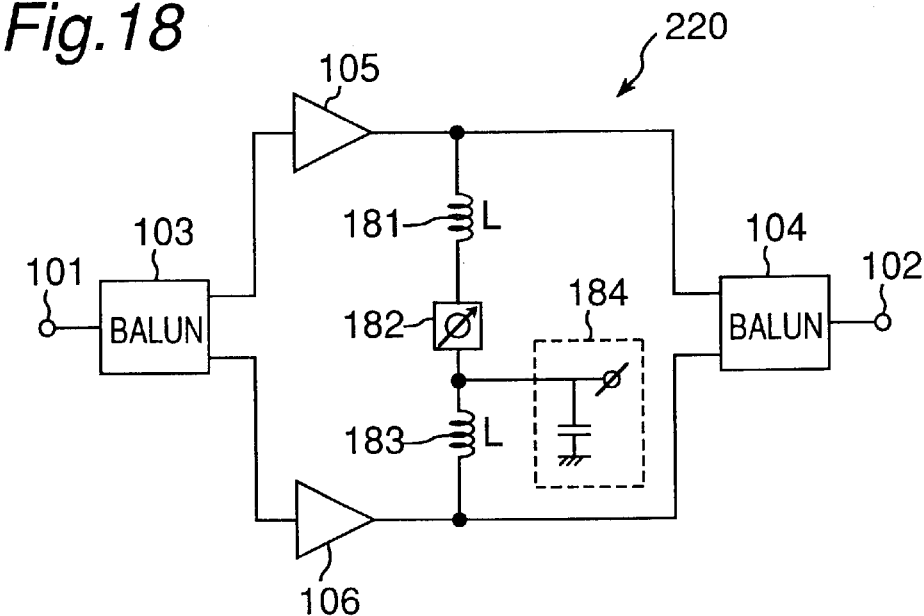
FIG. 18 is a block diagram of the power amplifier according to embodiment 5.

FIG. 18 is a block diagram showing the configuration of the power amplifier 220 according to embodiment 5. The power amplifier 220 has functions same as the power amplifiers described in embodiments 1 through 4. That is, when a plurality of signals of sufficiently small frequency intervals with respect to the signal frequency are entered, the power amplifier 220 reduces intermodulation distortion (in particular, third-order intermodulation distortion) and outputs the amplified signals free of phase shift to the input signals.

What the power amplifier 220 is different from the power amplifier 110 (FIG. 8) is that the first inductor 181, phase shifter 182, and second inductor 183 are connected in series across outputs of push-pull amplifiers 105 and 106. By the way, the configuration of the power amplifier 220 is similar to the configuration of the power amplifier 110 (FIG. 8). Consequently, like reference numerals are given to like composition elements already explained and their explanations are omitted.

The inductors 181, 183 provide high impedance to the frequencies of signals outputted from amplifiers 105 and 106, and low impedance to the frequencies of signals of Δf component. Even in the case in which the frequency intervals Δf of a plurality of signals entered into the amplifiers vary, the intermodulation distortion can be reduced by connecting inductors 181, 183 across outputs of the amplifiers. The inductor is, for example, a choke coil which is jointly used by the bias line of the bias power supply 184 which applies bias voltage.

For the input signal of Δf component outputted from the amplifier 105, the phase shifter 182 reverses the phase opposite to the phase of the signal of the Δf component outputted from the amplifier 106, and outputs the signal. For the input signal of Δf component outputted from the amplifier 106, the phase shifter 182 reverses the phase opposite to the phase of the signal of the Δf component outputted from the amplifier 105, and outputs the signal. That is, the Δf components become nearly opposite phase at same amplitude and are reduced each other. Therefore, the third-order intermodulation distortion generated in the amplifier can be greatly reduced. Furthermore, by changing the phase with the phase shift caused by impedance of the circuit wiring taken into account, it is possible to offset the Δf component in such a manner that it becomes practically zero.

Figure 19:
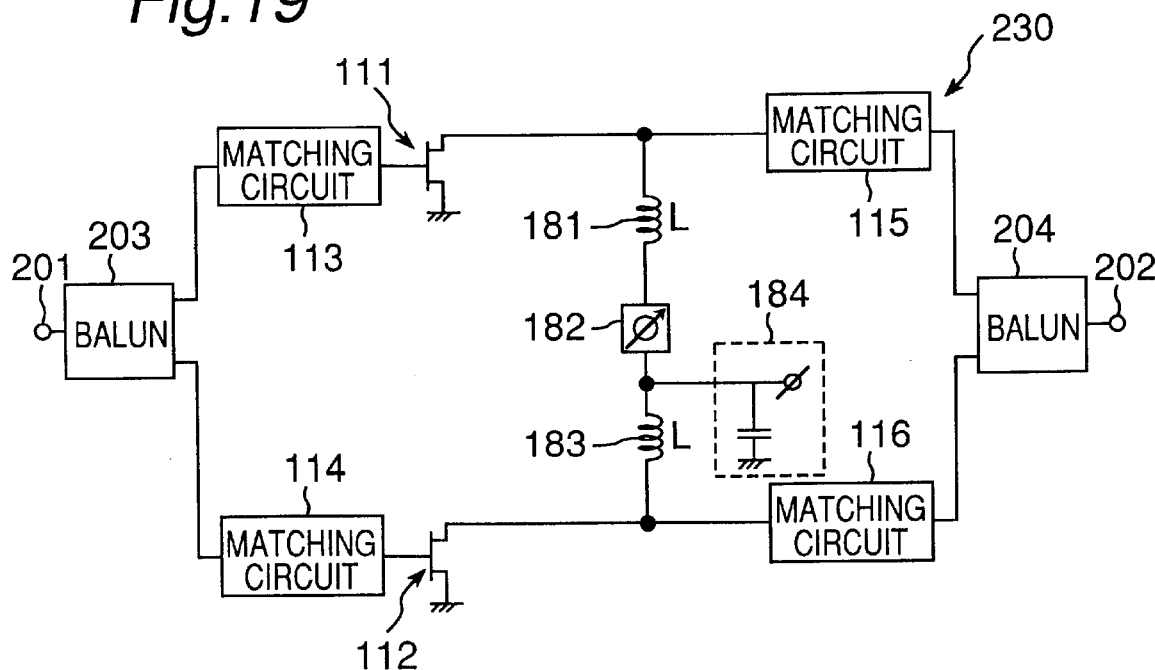
FIG. 19 is a block diagram of the configuration of the power amplifier.

Referring now to FIG. 19, the power amplifier 230 serially connecting the first inductor 181, phase shifter 182, and the second inductor 183 is described. Characteristics of inductors 181, 183 and the operation of the phase shifter 182 are same as described above.

The configuration of the power amplifier 100 (FIG. 7) is similar to the configuration of the power amplifier 230. FIG. 19 is a block diagram showing the configuration of the power amplifier 230. What the power amplifier 230 is different from the power amplifier 100 (FIG. 7) is that the first inductor 181, phase shifter 182, and second inductor 183 are connected in series in place of capacitor 107 (FIG. 7), and the bias power supply 184 for applying the bias voltage is connected across the phase shifter 182 and second inductor 183. Furthermore, by providing the bias power supply 184, matching circuits 131 through 134 can be omitted.

By configuring in this way, because the Δf component can be reduced by bringing it to the same amplitude and nearly opposite phase by the phase shifter, third-order intermodulation distortion arising from the Δf component can be greatly reduce.

(Embodiment 6)

Figure 20:
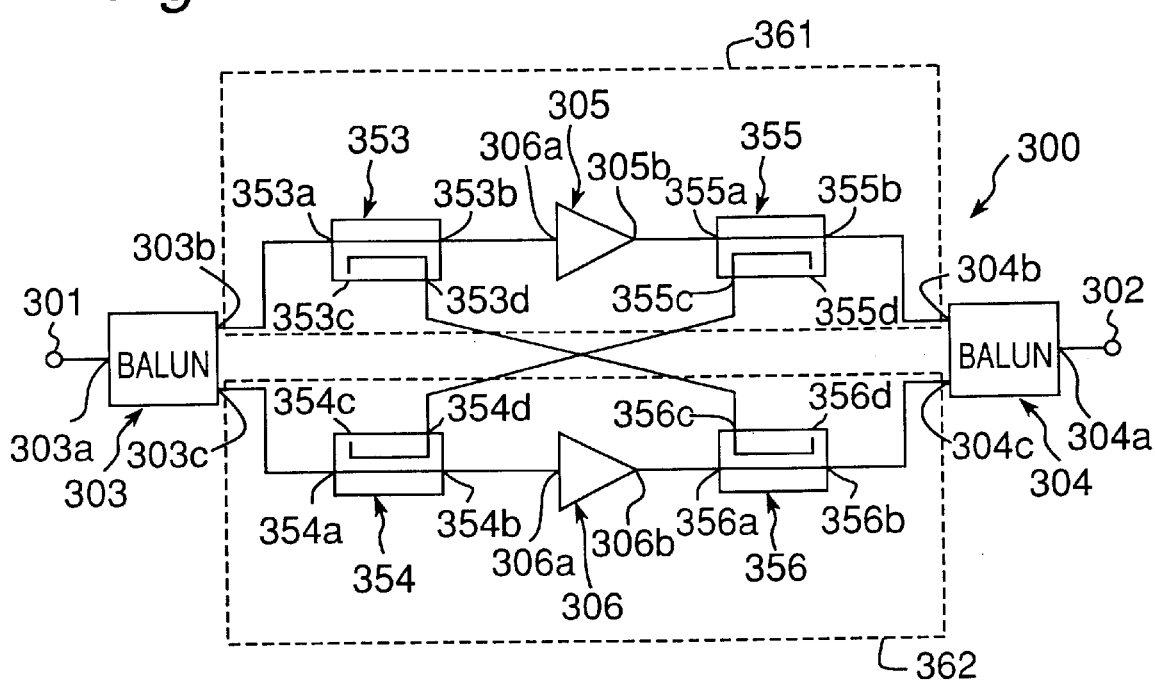
FIG. 20 is a block diagram of the power amplifier according to embodiment 6.

FIG. 20 is a block diagram showing the configuration of the power amplifier according to embodiment 6. The power amplifier 300 comprises an input terminal 301, the first balun 303 comprising an input 303a, first output 303b and second output 303c, first through forth directional couplers 353 through 356, an amplifier 305 that has an input 305a and an output 305b and amplifies input signals, an amplifier 306 that has an input 306a and an output 306b and amplifies input signals, the second balun 304 comprising an input 304a, first output 304b and second output 304c, and an output terminal 302.

The connection relation in the power amplifier 300 is shown as follows. The input terminal 301 is connected to the input 303a of the balun 303. The first output 303b and the second output 303c of the balun 303 are connected to the first terminal 353a of the first directional coupler 353 and the first terminal 354a of the second directional coupler 354, respectively. The second terminal 353b of the first directional coupler 353 is connected to the input 305a of the amplifier 305 and the second terminal 354b of the second directional coupler 354 is connected to the input 306a of the amplifier 306. The output 305b of the amplifier 305 is connected to the first terminal 355a of the third directional coupler 355 and the output 306b of the amplifier 306 is connected to the first terminal 356a of the fourth directional coupler 356. The second terminal 355b of the third directional coupler 355 and the second terminal 356b of the fourth directional coupler 356 are connected to the first input 304b and the second input 304c of the balun 304, respectively. The output 304a of the balun 304 is connected to the output terminal 302.

Furthermore, the third terminal 355c of the third directional coupler 355 and the forth terminal 354d of the second directional coupler 354 are connected, and the third terminal 356c of the forth directional coupler 356 and the fourth terminal 353d of the first directional coupler 353 are connected.

Hereinafter, a course arriving at the first input 304b of the balun 304 from the first output 303b of the balun 303 via the first directional coupler 353, amplifier 305, and the third directional coupler 355 is called the first amplification path 361. In addition, a course arriving at the second input 304c of the balun 304 from the second output 303c of the balun 303 via the second directional coupler 354, amplifier 306, and fourth directional coupler 356 is called the second amplification path 362.

Figure 21:
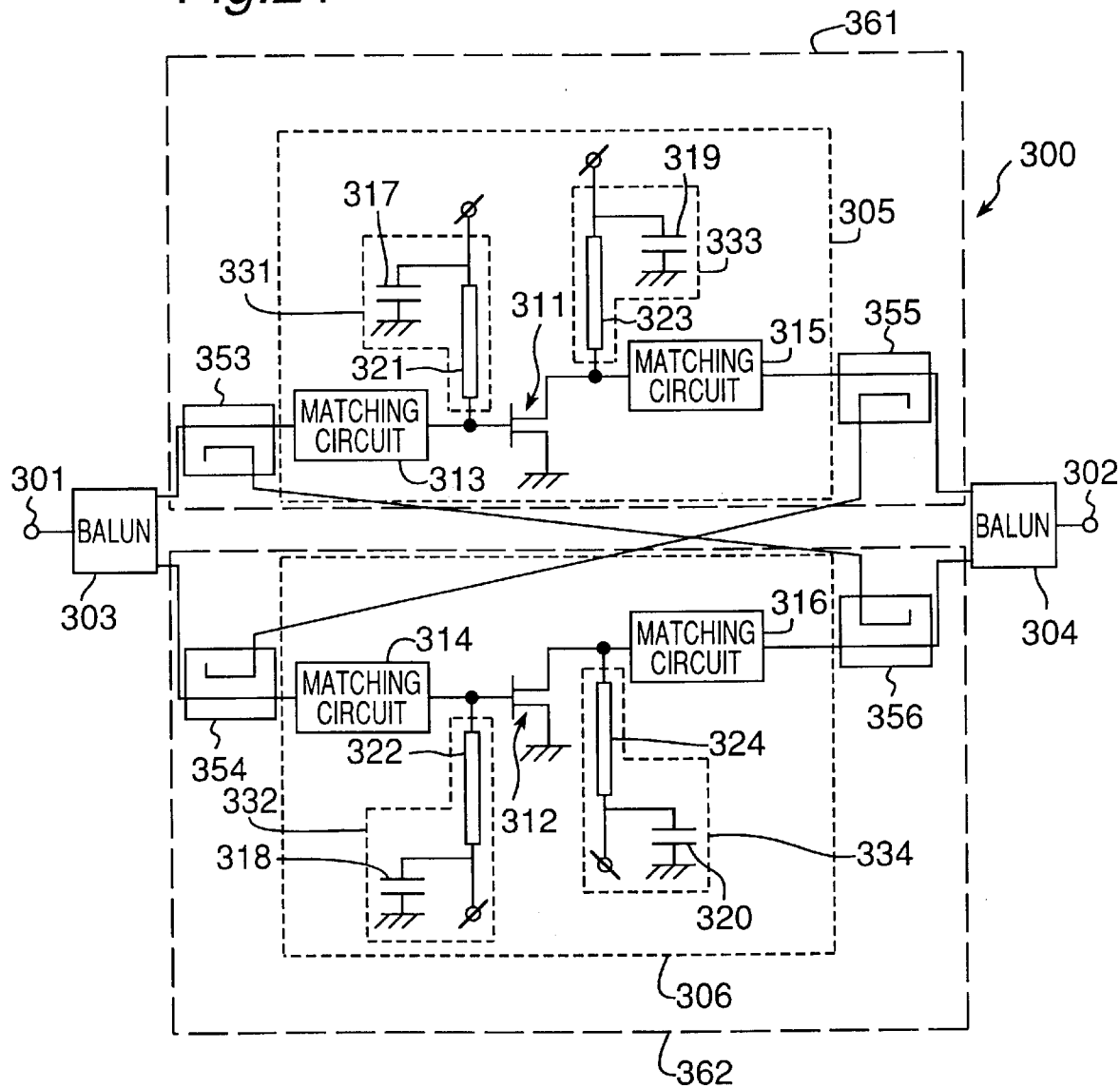
FIG. 21 is a diagram of the specific circuit configuration of the power amplifier.

FIG. 21 shows a specific circuit configuration of the power amplifier 300. The configuration of amplifiers 305 and 306 are same as that of the amplifiers 105, 106 described in embodiment 1. Consequently, their explanation will be omitted. The basic functions of the power amplifier 300 are same as those of embodiment 1. The amplifiers 305 and 306 function as push-pull amplifiers.

In Embodiment 6, a case in which two signals of frequencies f1 and f2 are entered in the power amplifier 300 is considered. The frequency interval Δf is assumed to sufficiently smaller than the signal frequencies. As described in embodiment 1, it is again an object of the embodiment 6 to reduce Δf in order to reduce intermodulation distortion, in particular, third-order intermodulation distortion.

Now, in embodiment 6, a directional coupler which has, for example, 3 dB degree of coupling with respect to the frequency Δf that expresses the frequency intervals of two signals, and which scarcely couples to the signal frequency is used. Referring now again to FIG. 20, the invention will be described more in detail. First of all, the signal of frequency Δf component generated by the nonlinearity of the amplifier 305 is taken out from the third terminal 355c of the third directional coupler 355, and entered in the amplifier 306 via the fourth terminal 354d of the second directional coupler 354. Similarly, the signal of frequency Δf component generated by the nonlinearity of the amplifier 306 is taken out from the third terminal 356c of the fourth directional coupler 356, and entered in the amplifier 305 via the fourth terminal 353d of the first directional coupler 353.

By configuring in this way, the Δf component with phase shifted from the Δf component generated by the nonlinearity of the amplifier 305 and with the same amplitude is entered in the amplifier 305, and as a result, the Δf component generated at the amplifier 305 is reduced. In addition, the Δf component of the same amplitude but with the phase shifted from the Δf component generated by the nonlinearity of the amplifier 306 is entered in the amplifier 306, and as a result, the Δf component generated at the amplifier 306 is reduced. As a result, mixing of the Δf component and signal frequencies (f1 and f2) does not occur, and the third-order intermodulation distortion generated at amplifiers 305, 306 can be reduced.

By the way, in the embodiment 6, the degree of coupling of the directional coupler is designated to 3 dB, but the effects for suppressing intermodulation distortion can be obtained even when the different values are used.

Figure 22:
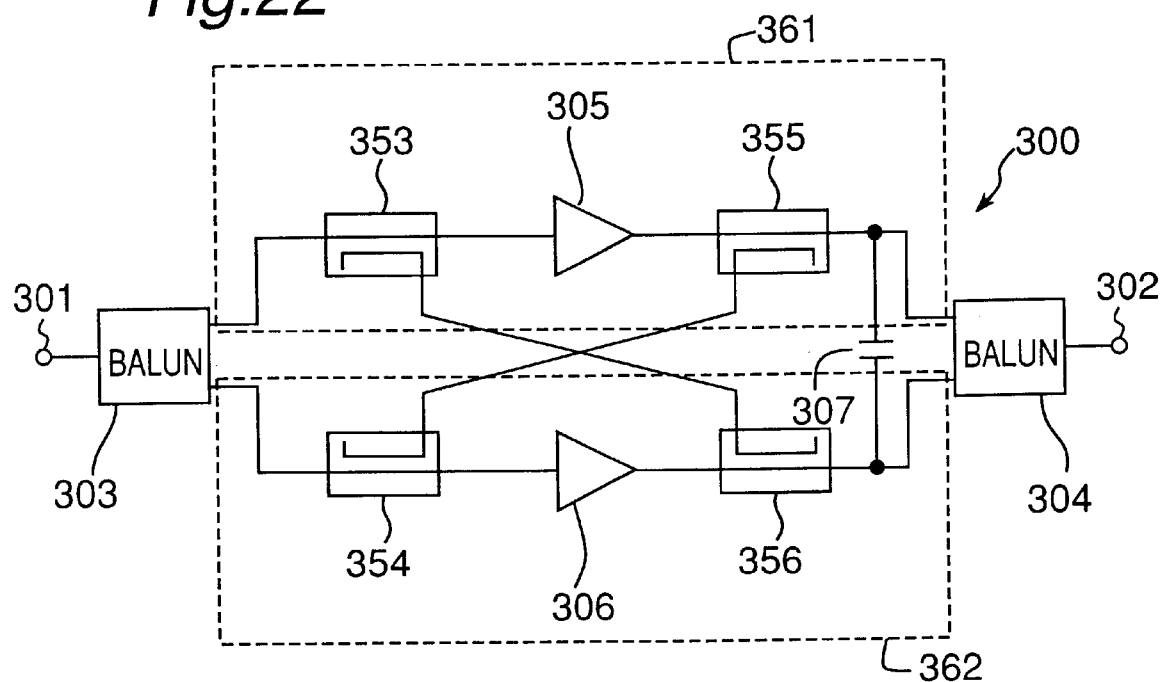
FIG. 22 is a block diagram of another example of power amplifier of FIG. 20.

As illustrated in FIG. 22, between the first amplification path 361 and the second amplification path 362, at least one or more capacitors 307 which provide low impedance at frequency Δf, which is the frequency intervals of the two signals, can be added across the first amplification path 361 and the second amplification path 362. In place of the capacitor 307 (FIG. 19), one or more inductor (not shown) which provide low impedance at frequency Δf, which is the frequency intervals of two signals, may be added. It is possible to suppress intermodulation distortion with respect to a wider range of Δf by shifting the frequency which increases the degree of coupling of the directional coupler and the self-resonance frequency of the capacitor or by shifting the frequency which increases the degree of coupling of the directional coupler and the frequency which enables the inductor to provide low impedance.

By the way, the place of connecting the capacitor 307 or inductor (not shown) can be freely set if it is located between the first amplification path 361 and the second amplification path 362. Even in such event, needless to say, the effects same as in the case of the present embodiment can be obtained.

(Embodiment 7)

Referring now to FIG. 23 through FIG. 30, another examples to which the present invention can be applied are described. All examples intend to reduce the signals of frequency Δf, frequency interval of two input signals, which cause third-order intermodulation distortion.

Figure 23:
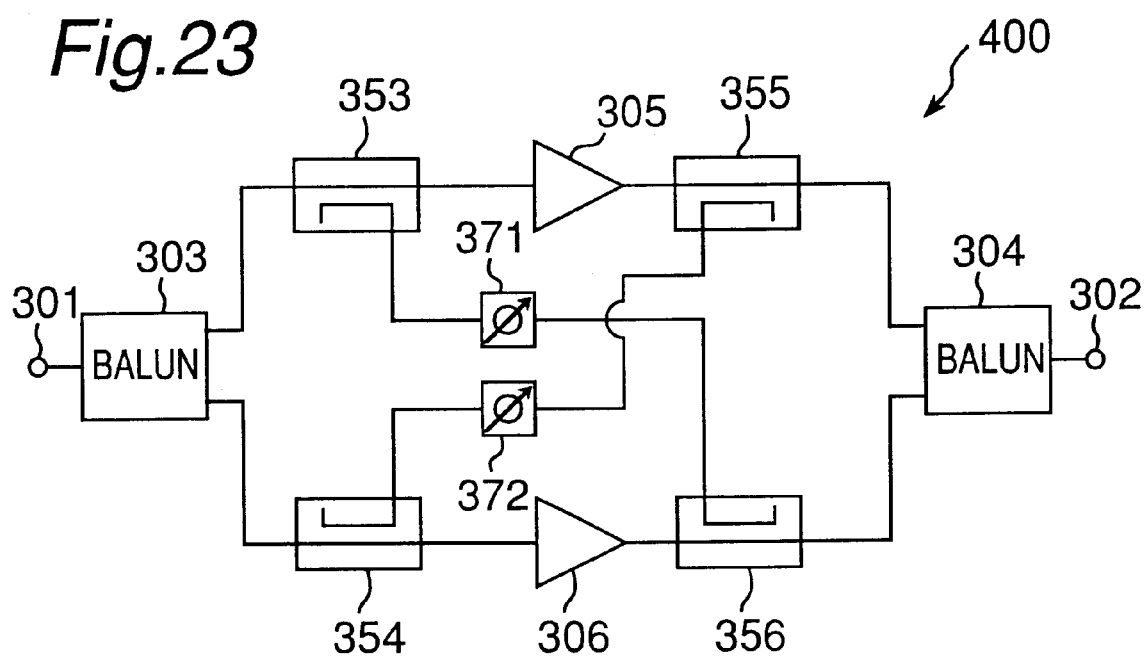
FIG. 23 is a block diagram of the configuration of the first power amplifier according to embodiment 7.

FIG. 23 is a block diagram showing the configuration of the first power amplifier 400 according to embodiment 7. The power amplifier 400 is a modified example of the power amplifier 300 (FIG. 20) described in embodiment 6. Hereinafter, component elements in which the power amplifier 400 differ from the power amplifier 300 (FIG. 20) only will be described and the explanation of same component elements will be omitted.

What makes the power amplifier 400 different from the power amplifier 300 (FIG. 20) is the phase shifter 371 located on the wiring that reaches from the fourth directional coupler 356 to the first directional couple 353 for transmitting the signal of Δf component, and a phase shifter 372 located on the wiring reaching from the third directional coupler 355 to the second directional coupler 354. The phase shifters 371, 372 can vary the phase of input signals. Specifically, for the signal of Δf component outputted from the amplifier 305, the phase shifter 371 inverts the phase of the signal of Δf component outputted from the amplifier 306 and outputs the signal. For the input signal of Δf component outputted from the amplifier 306, the phase shifter 372 inverts the phase of the signal of Δf component outputted from the amplifier 305 and outputs the signal. As a result, the Δf component becomes the same amplitude and nearly opposite phase with respect to the Δf components generated at amplifiers 305, 306, and the Δf components generated at amplifiers 305, 306 are reduced. Accordingly, the third-order intermodulation distortion generated in the amplifier can be greatly reduced. Furthermore, by changing the phase with the phase shift caused by impedance of circuit wiring taken into account, it is possible to offset Δf components in such a manner that Δf components become practically zero.

Figure 24:
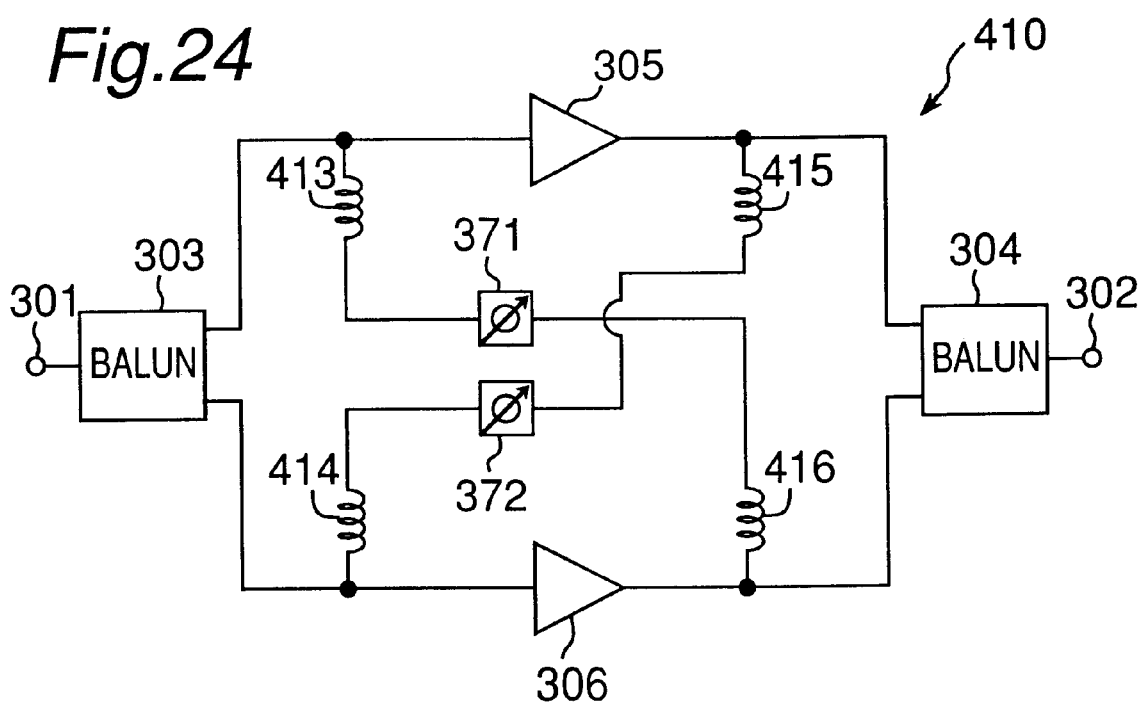
FIG. 24 is a block diagram of the configuration of the second power amplifier according to embodiment 7.

FIG. 24 is a block diagram showing the configuration of the second power amplifier 410 according to embodiment 7. The power amplifier 410 is a modified example of the power amplifier 400 (FIG. 23). Hereinafter, component elements in which the power amplifier 410 is different from the power amplifier 400 (FIG. 23) only will be described and the explanation of same component elements will be omitted.

What makes the power amplifier 410 different from the power amplifier 400 (FIG. 23) is that inductors 413 through 416 are disposed in place of directional couplers 353 through 356. Inductors 413 through 416 are, for example, choke coils, and provide low impedance at frequency Δf. According to this configuration, in the power amplifier 410, the Δf components can be extracted and reduced as is the case of the power amplifier 400 (FIG. 23). As a result, the third-order intermodulation distortion generated in the amplifier can be greatly reduced. Furthermore, by changing the phase with the phase shift caused by impedance of circuit wiring taken into account, it is possible to offset Δf components in such a manner that Δf components become practically zero.

Figure 25:
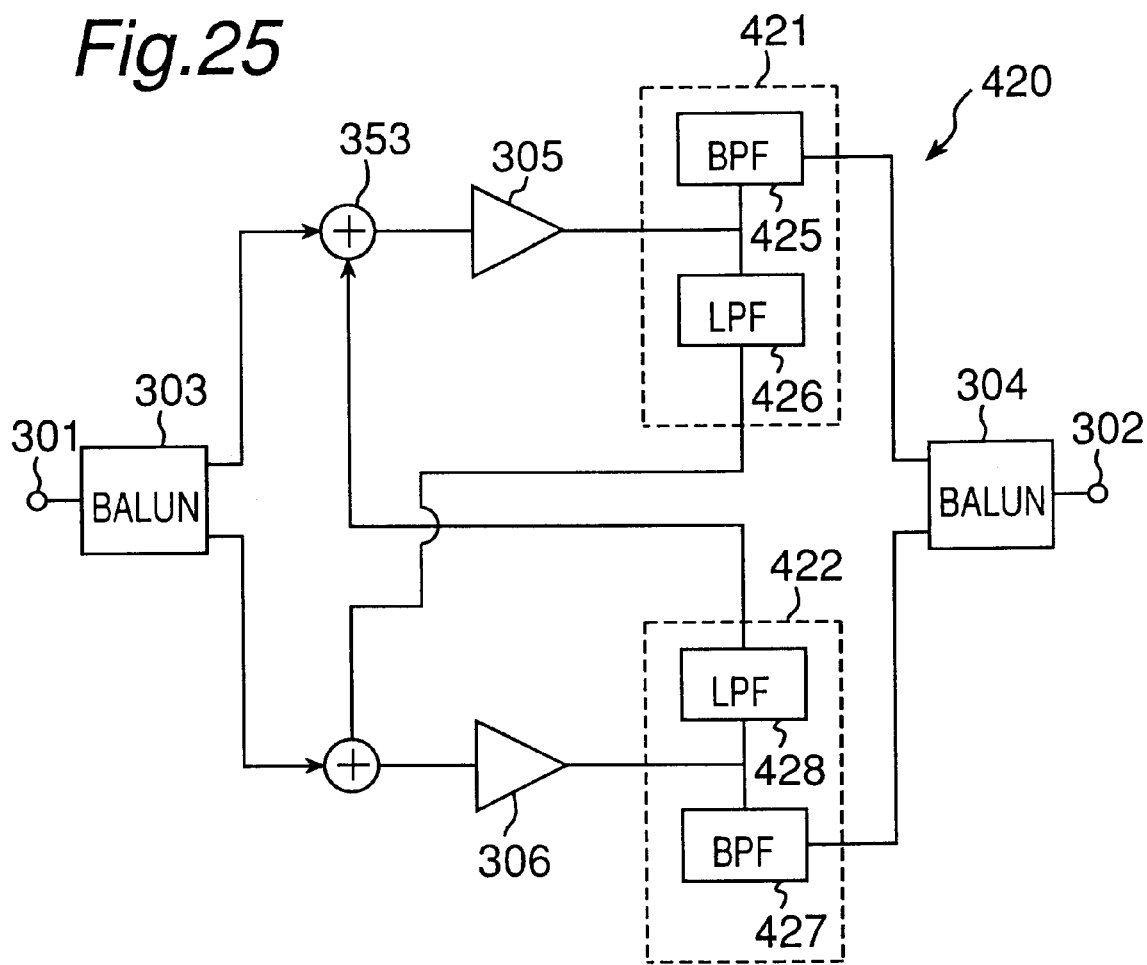
FIG. 25 is a block diagram of the configuration of the third power amplifier according to embodiment 7.

FIG. 25 is a block diagram showing the configuration of the third power amplifier 420 according to embodiment 7.

The power amplifier 420 is a modified example of the power amplifier 300 (FIG. 22). Hereinafter, component elements in which the power amplifier 420 differ from the power amplifier 300 (FIG. 22) only will be described and the explanation of same component elements will be omitted.

What makes the power amplifier 420 different from the power amplifier 300 (FIG. 22) is the diplexers 421, 422 disposed in place of the directional couplers 353 through 356. Diplexers 421, 422 separate signals in accordance with their frequency. More specifically, diplexers 421, 422 allow the primary frequency component of the signals (i.e. f1, f2) to pass to the balun 304 and all the differential frequency component of the signals (i.e. Δf) to pass to amplifiers 305, 306 on the path on the opposite side.

Diplexers 421, 422 include the band pass filters (BPF) 425, 427 that contain frequencies f1, f2 (for example, GHz band) in the passing band and the low-pass filters (LPF) 426, 428 that contain the frequency Δf (for example, MHz band) in the passing band and do not contain frequencies f1, f2, respectively. Low pass filters (LPF) 426, 428 can be said impedance elements same as capacitor 107 (FIG. 1), inductor 108 (FIG. 11), etc.

The output signal from the amplifier 306 is entered in the diplexer 422. The diplexer 422 allows the primary frequency component f1, f2 of signals to pass to balun 304 by the band pass filer 427 and allows the differential frequency component Δf of the signals to pass to the amplifier 305 by the low pass filter 428. Note that passed the low pass filter 428 gives a specified shift to the phase of the inputted signal. If this shift amount is designed to achieve, for example, about 180°, the Δf component entered in the amplifier 305 becomes nearly reversal to the Δf component generated at the amplifier 305 with the same amplitude. As a result, the Δf component generated at the amplifier 305 can be reduced. By the way, the functions of the diplexer 421 are same as those of diplexer 422. That is, by the band pass filter 425, the primary frequency component of frequencies f1, f2 is allowed to pass the balun 426, and the differential frequency component Δf is outputted to the amplifier 306 by the low pass filter 426. The Δf component entered in the amplifier 306 reduces the Δf component generated at the amplifier 306. As a foregoing result, third-order intermodulation distortion generated at the amplifier can be greatly reduced.

Figure 26:
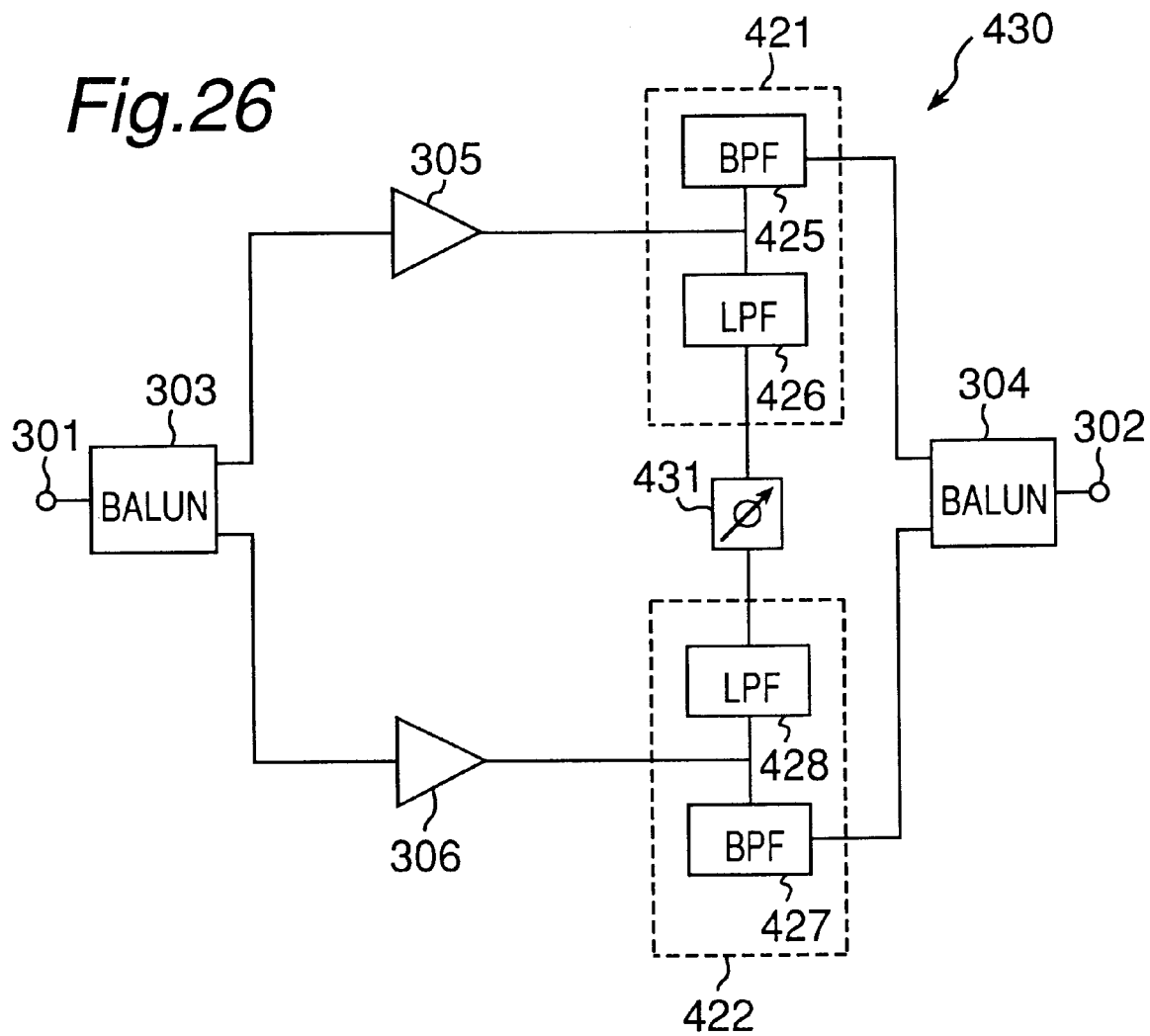
FIG. 26 is a block diagram of the configuration of the forth power amplifier according to embodiment 7.

FIG. 26 is a block diagram showing the configuration of the fourth power amplifier 430 according to embodiment 7. The power amplifier 430 is a modified example of the power amplifier 420 (FIG. 25). What makes the power amplifier 440 different from the power amplifier 420 (FIG. 25) is that the Δf component is reduced not at amplifiers 305, 306 but across outputs of diplexer 421 and diplexer 422. In addition, since the phase of the Δf component is adjusted by the phase shifter 431, the phase characteristics of the low pass filter contained in the diplexer would not be particularly brought into question.

To explain more specifically, the Δf component generated at the amplifier 306 is extracted by the low pass filter 428 and entered in the phase shifter 431. The phase shifter 431 adjust the phase of the Δf component entered in such a manner that it has the phase opposite to the Δf component entered in the diplexer 422 and outputs to the low pass filter 426. The low pass filer 426 allows the Δf component whose phase is shifted by 180°. On the other hand, from the amplifier 305, amplified signal containing the Δf component generated at the amplifier 305 is entered. As a result, the Δf component generated at the amplifier 305 is reduced by the Δf component received from the phase shifter. This is the processing carried out at the diplexer 431, and at the diplexer 422, processing that reduces the Δf component simultaneously is carried out. This process can be explained by replacing the diplexer 421 with the diplexer 422 in the description above, and the explanation is omitted. By the above-mentioned processing, the Δf component is reduced and the signal with third-order intermodulation distortion greatly reduced is entered from band pass filters 425, 427 to the balun 304.

Figure 27:
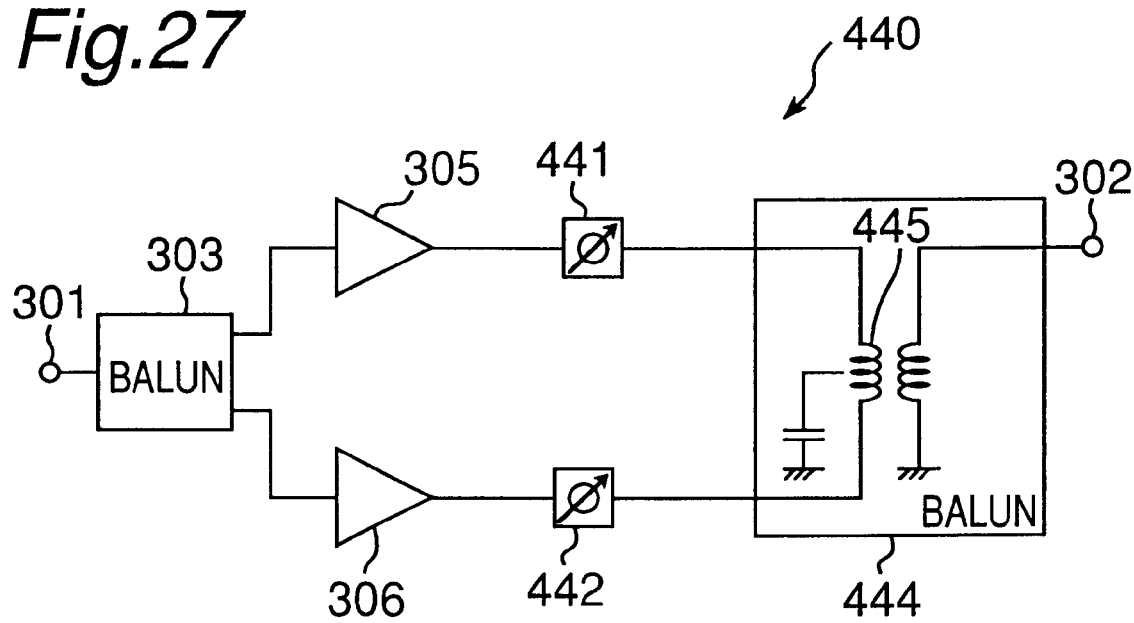
FIG. 27 is a block diagram of the configuration of the fifth power amplifier according to embodiment 7.

FIG. 27 is a block diagram showing the configuration of the fifth power amplifier 440 according to embodiment 7. The features of the power amplifier 440 lie in that phase shifters 441, 442 are disposed to the outputs of amplifiers 305, 306 and two inputs of balun 444 are electrically connected by the inductor 445. Phase shifters 441, 442 are designed to shift the phases by 90° each, respectively. In addition, the inductor 445 has a characteristic to provide low impedance with respect to the frequency Δf, which is the frequency interval of two input signals. The balun 444 has functions to amplify and convert and output two input signals with their phases only shifted by 180° each other into one signal, and serves in the same manner as the balun 104 (FIG. 1).

The principle in which the power amplifier 440 configured in this way reduces the Δf component will be described. First of all, the Δf component generated in the amplifier 306 has the phase shifted by 90° at the phase shifter 442. The Δf component has the phase further shifted by 90° at the phase shifter 441 via the inductor 445 of the balun 444, where the inductor provides low impedance with respect to the frequency Δf. Because the phase shifter 441 shifts the phase in the direction same as the phase shifter 442 shifted, the phase of the Δf component generated in the amplifier 306 is finally shifted by 180°. The Δf component is entered in the amplifier 305 and reduces the Δf component generated at the amplifier 305. In the amplifier 306, too, the Δf component is reduced simultaneously by the processing same as the foregoing processing. As a result, the Δf component is reduced and the signal with the third-order intermodulation distortion greatly reduced is entered in the balun 444.

Figure 28:
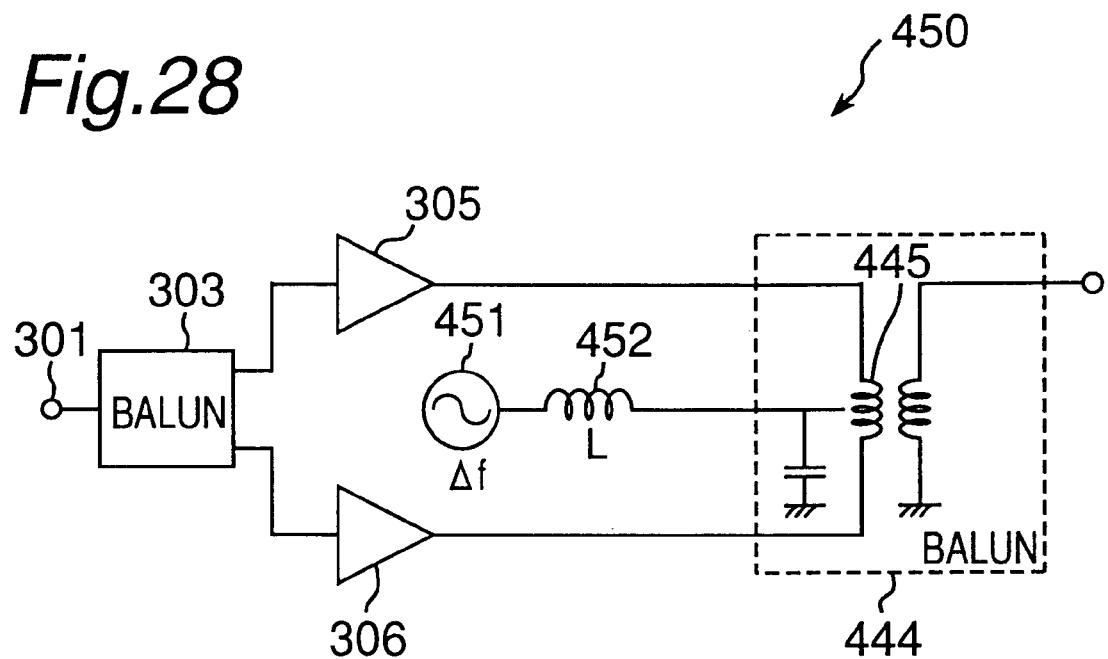
FIG. 28 is a block diagram of the configuration of the sixth power amplifier according to embodiment 7.

FIG. 28 is a block diagram showing the configuration of the sixth power amplifier 450 according to embodiment 7. The features of the power amplifier 450 lie in that the power supply 451 for outputting the signal of frequency Δf, frequency intervals of two input signals, is disposed. The frequency Δf to be outputted can be obtained by drawing out from the output terminal of amplifiers 305 or 306. Alternatively, the signals on the input side may be detected to generate the signals of frequency Δf. The signals of frequency Δf outputted from the power supply 451 are inputted to a median of the transformer-side port (inductor 445) of balun 444 via the inductor 452 which provides low impedance with respect to frequency Δf. The inductor 445 as well has a characteristic in that it provides low impedance with respect to frequency Δf. The signal of frequency Δf is inputted to amplifiers 305, 306 from the inductor 445. The signal of frequency Δf when it is entered to amplifiers 305, 306 has the phase varied by passing the inductors 452, 445. As a result, the Δf component generated at the amplifiers 305, 306 can be reduced. By the way, with the phase shift arising from inductors 452, 445 taken into account, the phase of the signal outputted by the power supply 451 may be adjusted so that the signal of frequency Δf entered into amplifiers 305, 306 is shifted by 180° from the phase of the Δf component generated. The Δf component generated at amplifiers 305, 306 can be more definitely reduced.

Figure 29:
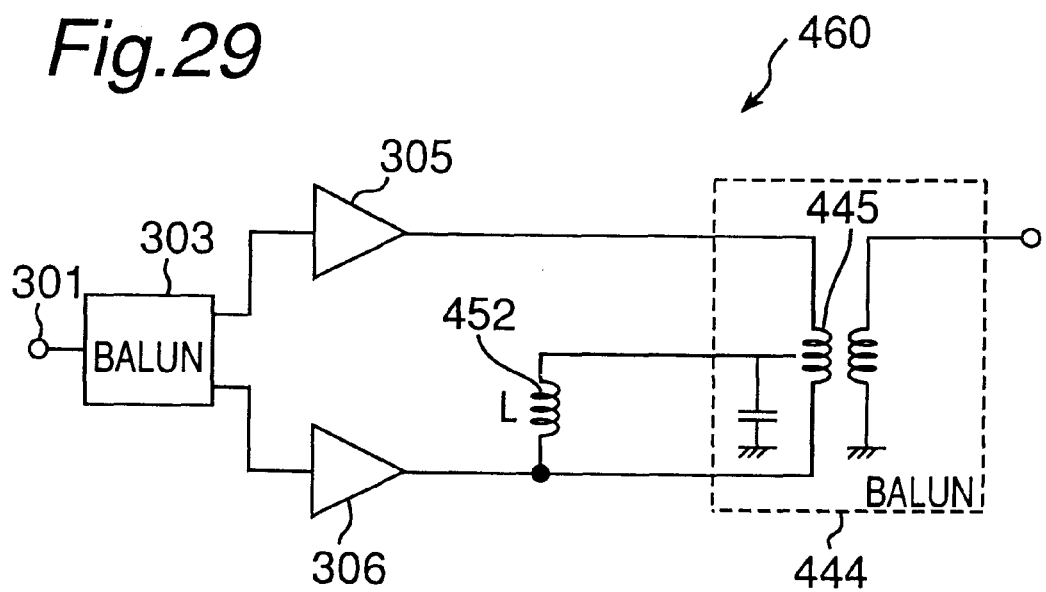
FIG. 29 is a block diagram of the configuration of the seventh power amplifier according to embodiment 7.

When the frequency Δf of the signal to e outputted is extracted from the output terminal of either amplifier 305 or 306, the power supply 451 may not be provided. FIG. 29 is a block diagram showing the configuration of the seventh power amplifier 460 according to embodiment 7. As clear from the drawing, the power supply 451 (FIG. 28) is omitted and the output of the amplifier 306 is entered into the median of the transform-side port (inductor 445) of the balun 444 via the inductor 452.

Figure 30:
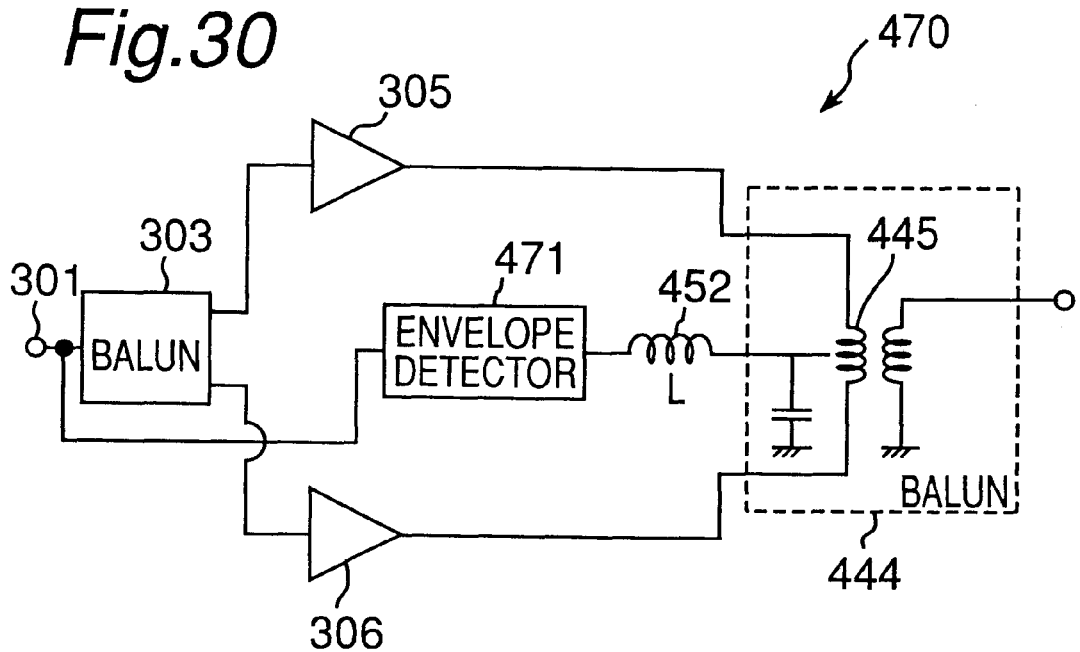
FIG. 30 is a block diagram of the configuration of the eighth power amplifier according to embodiment 7.
Figure 31:
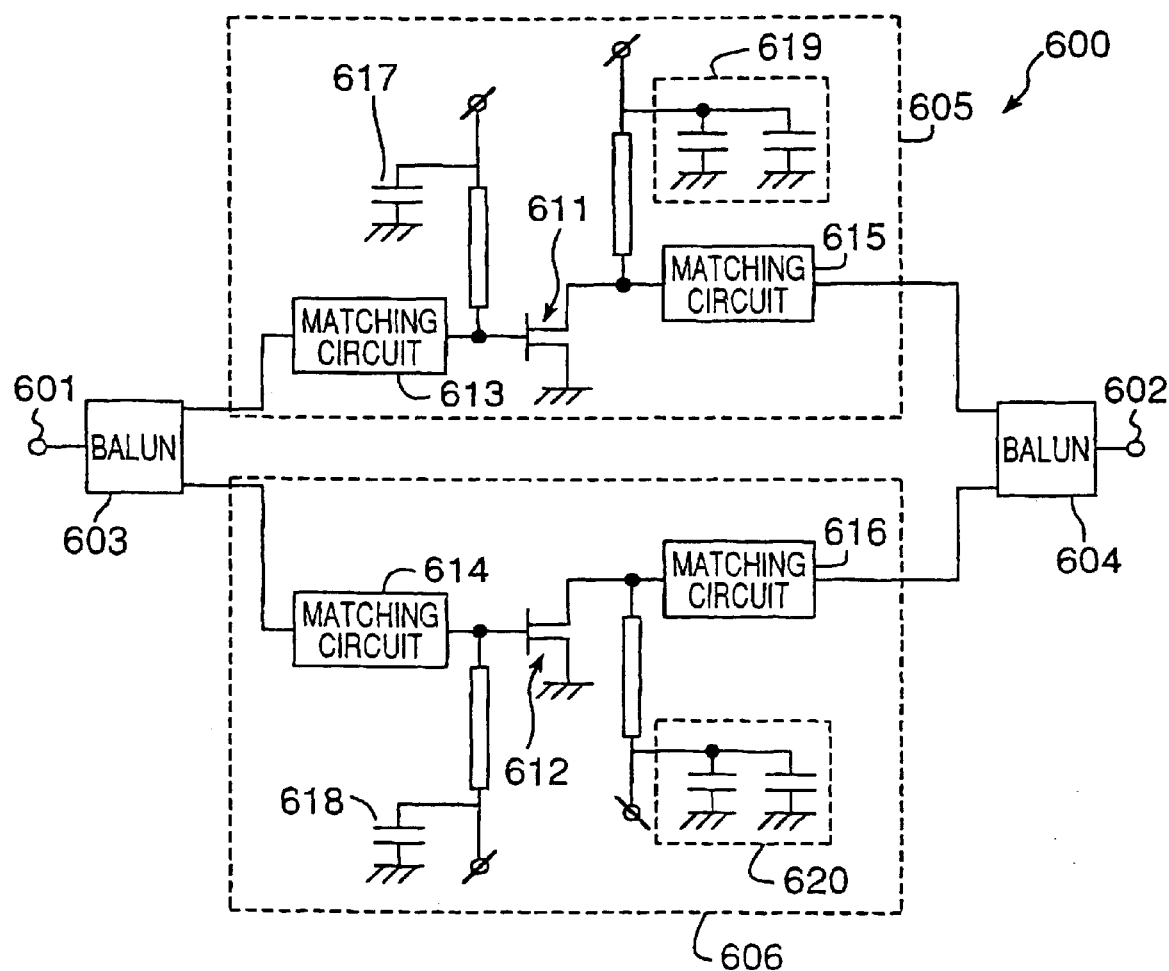
FIG. 31 is a diagram of a conventional power amplifier.

When the frequency Δf of the signal to be outputted is generated by detecting the signal inputted from the input terminal 301, the configuration shown in FIG. 30 is effective. FIG. 30 is a block diagram showing the configuration of the eighth power amplifier 470 according to embodiment 7. The feature of the power amplifier 470 lies in the location of the envelope detector 471. The envelope detector 471 envelope-detects the signal entered from the input terminal 301 and detects and outputs the signal of frequency Δf, which is the frequency interval of two input signals.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

The present disclosure relates to subject matter contained in priority Japanese Patent Application No. 2000-323074, filed on Oct. 23, 2000, the contents of which is herein expressly incorporated by reference in its entirety.

What is claimed is:

1. A power amplifier comprising:
   a first balun including an input section that inputs a combined signal combining two signals of different frequencies, a first output section that outputs a first signal having a first phase, and a second output section that outputs a second signal having a second phase opposite to the first phase;
   a first amplifier that outputs a first amplified signal containing a differential frequency component of the two signals, by receiving and amplifying the first signal;
   a second amplifier that outputs a second amplified signal containing the differential frequency component of the two signals, by receiving and amplifying the second signal;
   a second balun including a first input section, a second input section, and an output section that outputs a combined signal comprising the signal entered from the first input section and from the second input section;
   a coupler comprising an impedance element having low impedance with respect to the differential frequency component through which the differential frequency component contained in the second amplified signal is input into a first amplification path reaching the first input section of the second balun from the first output section of the first balun via the first amplifier,
   wherein the differential frequency component is reduced and the first amplified signal with the reduced differential frequency component is entered in the first input section of the second balun; and
   the differential frequency component contained in the first amplified signal is input through the coupler into a second amplification path reaching the second input section of the second balun from the second output section of the first balun via the second amplifier,
   wherein the differential frequency component is reduced and the second amplified signal with the reduced differential frequency component is entered in the second input section of the second balun.

2. A power amplifier according to claim 1, wherein the phase of the differential frequency component contained in the amplified signal differs from the phase of the inputted differential frequency component to reduce the differential frequency component.

3. A power amplifier according to claim 1, further comprising:
   a phase shifter connected to the impedance element in series, said phase shifter receiving the differential frequency component contained in the first amplified signal and the differential frequency component contained in the second amplified signal, adjusting the phase of each differential frequency component, and outputting the signals with phases opposite to each other.

4. A power amplifier according to claim 1, further comprising:
   a first directional coupler connected to the first amplification path, said first directional coupler receiving the first amplified signal; and
   a second directional coupler connected to the second amplification path, said second directional coupler receiving the second amplified signal,
   wherein the first directional coupler extracts the differential frequency component of the first amplified signal and outputs to the second directional coupler, and receives the differential frequency component contained in the second amplified signal from the second directional coupler to reduce the differential frequency component, and generates the first amplified signal With the differential frequency component reduced, and
   wherein the second directional coupler extracts the differential frequency component of the second amplified signal and outputs to the first directional coupler, and receives the differential frequency component contained in the first amplified signal from the first directional coupler to reduce the differential frequency component, and generates the second amplified signal with the differential frequency component reduced.

5. A power amplifier according to claim 4, further comprising:
   a first phase shifter provided across the output of the first directional coupler and the input of the second directional coupler, said first phase shifter receiving the differential frequency component contained in the first amplified signal, adjusting the phase of the differential frequency component, and outputting the differential frequency component with the phase made opposite to that of the differential frequency component contained in the second amplified signal; and
   a second phase shifter provided across the output of the second directional coupler and the input of the first directional coupler, said second phase shifter receiving the differential frequency component contained in the second amplified signal, adjusting the phase of the differential frequency component, and outputting the differential frequency component with the phase made opposite to that of the differential frequency component contained in the first amplified signal.

6. A power amplifier according to claim 4, wherein the first directional coupler and the second directional coupler have 3 dB or more degree of coupling with respect to the differential frequency component.

7. A power amplifier according to claim 1, further comprising:
- a first directional coupler connected to the first amplification path, said first directional coupler extracting and outputting the differential frequency component of the first amplified signal; and
- a second directional coupler connected to the second amplification path, said second directional coupler extracting and outputting the differential frequency component of the second amplified signal,
- wherein the first amplifier receives the differential frequency component contained in the second amplified signal outputted from the second directional coupler to reduce the differential frequency component and generates the first amplified signal with the differential frequency component reduced, and
- wherein the second amplifier receives the differential frequency component contained in the first amplified signal outputted from the first directional coupler to reduce the differential frequency component and generates the second amplified signal with the differential frequency component reduced.

8. A power amplifier according to claim 7, wherein the first directional coupler and the second directional coupler have 3 dB or more degree of coupling with respect to the differential frequency component.

9. A power amplifier according to claim 1, wherein the impedance element is a capacitive element.

10. A power amplifier according to claim 1, wherein the impedance element is an inductive element.

11. A power amplifier according to claim 1, wherein the impedance element is a low pass filter.

12. A power amplifier according to claim 1, further comprising another impedance element, a self-resonance frequency of said another impedance element being different than a self-resonance frequency of said impedance element.

13. A power amplifier according to claim 1, wherein the first amplifier comprises:
- a first matching circuit for matching the impedance on the input side of the first amplifier;
- a first amplifying element connected to the output of the first matching circuit; and
- a second matching circuit connected to the output of the first amplifying element, said second matching circuit matching the impedance on the output side of the first amplifier, and
- wherein the second amplifier comprises:
  - a third matching circuit for matching the impedance on the input side of the second amplifier;
  - a second amplifying element connected to the output of the third matching circuit; and
  - a fourth matching circuit connected to the output of the second amplifying element, said fourth matching circuit matching the impedance on the output side of the second amplifier.

14. A power amplifier according to claim 13, wherein the impedance element is connected across the output of the first amplifier and the output of the second amplifier.

15. A power amplifier according to claim 13, wherein the impedance element is connected across the output of the first amplifying element and the output of the fourth matching circuit.

16. A power amplifier according to claim 13, wherein the impedance element is connected across the output of the second matching circuit and the input of the fourth matching circuit.

17. A power amplifier according to claim 1, further comprising:
- a first impedance element, connected to the first amplification path, to pass the differential frequency component of the first amplified signal; and
- a second impedance element, connected to the second amplification path, to pass the differential frequency component of the second amplified signal,
- wherein the first amplifier reduces the differential frequency component by receiving the differential frequency component contained in the second amplified signal via the second impedance and generates the first amplified signal with the differential frequency component reduced, and
- wherein the second amplifier reduces the differential frequency component by receiving the differential frequency component contained in the first amplified signal via the first impedance and generates the second amplified signal with the differential frequency component reduced.

18. A power amplifier according to claim 17, wherein the impedance element is a low pass filter.

19. A power amplifier according to claim 1, further comprising:
- a first phase shifter located across the output of the first amplifier and the first input section of the second balun, said first phase shifter outputting a phase of an inputted signal by shifting the phase of the inputted signal by 90° in a specified direction; and
- a second phase shifter located across the output of the second amplifier and the second input section of the second balun, said second phase shifter outputting a phase of an inputted signal by shifting the phase of the inputted signal by 90° in the specified direction,
- wherein the second balun further comprises an impedance element connecting the first input section and the second input section to pass the differential frequency component.

20. A power amplifier according to claim 1, further comprising:
- a first low pass filter, connected to the first amplification path, to pass the differential frequency component of the first amplified signal;
- a second low pass filter, connected to the second amplification path, to pass the differential frequency component of the second amplified signal; and
- a phase shifter connected to the first low pass filter and the second low pass filter in series, said phase shifter receiving the differential frequency component contained in the second amplified signal, adjusting the phase of each differential frequency component and outputting the differential frequency component s in the phases opposite to each other.

21. A power amplifier according to claim 1, further comprising:
- a power supply for outputting a signal of a differential frequency component whose phase is opposite to the phase of the signal of the differential frequency component,
- wherein the second balun receives the signal outputted from the power supply and inputs the signal to the first amplification path and the second amplification path via the first input section and the second input section.

22. A power amplifier according to claim 1, further comprising:

an impedance element, connected to one of the output of the first amplifier and the output of the second amplifier, to pass the differential frequency component, wherein the second balun receives the signal outputted from the impedance element and inputs the signal to the first amplification path and the second amplification path via the first input section and the second input section.

23. A power amplifier according to claim 1, further comprising:

a detection section for detecting an envelope, extracting and outputting the differential frequency component based on the combined signal inputted to the input section of the first balun, wherein the second balun receives the signal outputted from the detection section and inputs the signal to the first amplification path and the second amplification path via the first input section and the second input section.

24. A power amplifier according to claim 7, further comprising:

a first phase shifter provided across the output of the first directional coupler and the input of the second amplifier, said first phase shifter receiving the differential frequency component contained in the first amplified signal, adjusting the phase of the differential frequency component, and outputting the differential frequency component with the phase made opposite to that of the differential frequency component contained in the second amplified signal; and a second phase shifter provided across the output of the second directional coupler and the input of the first amplifier, said second phase shifter receiving the differential frequency component contained in the second amplified signal, adjusting the phase of the differential frequency component, and outputting the differential frequency component with the phase made opposite to that of the differential frequency component contained in the first amplified signal.

* * * * *

UNITED STATES PATENT AND TRADEMARK OFFICE
CERTIFICATE OF CORRECTION

PATENT NO.     : 6,545,542 B2
DATED          : April 8, 2003
INVENTOR(S)    : T. Matsuyoshi et al.

It is certified that error appears in the above-identified patent and that said Letters Patent is hereby corrected as shown below:

<u>Column 18,</u>
Line 34, "With" should be -- with --.

Signed and Sealed this

Seventh Day of October, 2003

JAMES E. ROGAN
*Director of the United States Patent and Trademark Office*